(12) United States Patent
Ichikawa

(10) Patent No.: US 8,872,231 B2
(45) Date of Patent: Oct. 28, 2014

(54) SEMICONDUCTOR WAFER, METHOD OF PRODUCING SEMICONDUCTOR WAFER, AND ELECTRONIC DEVICE

(75) Inventor: Osamu Ichikawa, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 274 days.

(21) Appl. No.: 13/301,279

(22) Filed: Nov. 21, 2011

(65) Prior Publication Data

US 2012/0104462 A1     May 3, 2012

Related U.S. Application Data

(63) Continuation-in-part of application No. PCT/JP2010/003369, filed on May 19, 2010.

(30) Foreign Application Priority Data

May 26, 2009  (JP) ................................. 2009-126761

(51) Int. Cl.
| | |
|---|---|
| H01L 27/06 | (2006.01) |
| H01L 21/8252 | (2006.01) |
| H01L 29/778 | (2006.01) |
| H01L 29/207 | (2006.01) |
| H01L 29/66 | (2006.01) |
| H01L 21/02 | (2006.01) |
| H01L 29/812 | (2006.01) |

(52) U.S. Cl.
CPC ......... H01L 29/7786 (2013.01); *H01L 21/0237* (2013.01); H01L 21/8252 (2013.01); H01L 27/0605 (2013.01); *H01L 21/02538* (2013.01); *H01L 21/02463* (2013.01); H01L 29/207 (2013.01); *H01L 21/02461* (2013.01); *H01L 29/812* (2013.01); *H01L 21/02573* (2013.01); *H01L 29/66462* (2013.01)
USPC ........... 257/194; 257/192; 257/195; 257/201; 257/E21.09; 257/E27.015; 438/199; 438/235; 438/285; 438/478

(58) Field of Classification Search
CPC ....... H01L 27/06; H01L 21/20; H01L 29/205; H01L 27/0605; H01L 29/207; H01L 29/66462; H01L 29/7786; H01L 21/8252; H01L 29/66
See application file for complete search history.

(56) References Cited

U.S. PATENT DOCUMENTS

| | | | |
|---|---|---|---|
| 4,821,090 A | | 4/1989 | Yokoyama |
| 5,455,451 A | * | 10/1995 | Usagawa et al. .............. 257/661 |

(Continued)

FOREIGN PATENT DOCUMENTS

| | | |
|---|---|---|
| JP | 60-120551 A | 6/1985 |
| JP | 02-213140 A | 8/1990 |

(Continued)

OTHER PUBLICATIONS

Translation of the International Preliminary Report on Patentability mailed Dec. 22, 2011, in International Application No. PCT/JP2010/003369.

(Continued)

*Primary Examiner* — Minh-Loan Tran
*Assistant Examiner* — Fazli Erdem
(74) *Attorney, Agent, or Firm* — Sughrue Mion, PLLC

(57) ABSTRACT

A semiconductor wafer includes a first semiconductor, and a second semiconductor formed directly or indirectly on the first semiconductor. The second semiconductor contains a first impurity atom exhibiting p-type or n-type conductivity, and a second impurity atom selected such that the Fermi level of the second semiconductor containing both the first and second impurity atoms is closer to the Fermi level of the second semiconductor containing neither the first impurity atom nor the second impurity atom, than the Fermi level of the second semiconductor containing the first impurity atom is. For example, the majority carrier of the second semiconductor is an electron, and the Fermi level of the second semiconductor containing the first and second impurity atoms is lower than the Fermi level of the second semiconductor containing the first impurity atom.

17 Claims, 17 Drawing Sheets

(56) References Cited

U.S. PATENT DOCUMENTS

| | | | |
|---|---|---|---|
| 5,567,961 A * | 10/1996 | Usagawa et al. | 257/197 |
| 6,462,362 B1 * | 10/2002 | Miyoshi | 257/198 |
| 6,914,274 B2 * | 7/2005 | Hiroyama et al. | 257/197 |
| 7,456,443 B2 * | 11/2008 | Saxler et al. | 257/194 |
| 2002/0038898 A1 * | 4/2002 | Sugiyama et al. | 257/378 |
| 2002/0121674 A1 * | 9/2002 | Welser et al. | 257/530 |
| 2003/0197185 A1 * | 10/2003 | Hiroyama et al. | 257/79 |
| 2004/0164319 A1 * | 8/2004 | Zampardi et al. | 257/196 |
| 2005/0184310 A1 * | 8/2005 | Krutko et al. | 257/197 |
| 2006/0081963 A1 * | 4/2006 | Rehder et al. | 257/565 |
| 2006/0113566 A1 * | 6/2006 | Krutko et al. | 257/197 |
| 2006/0131607 A1 * | 6/2006 | Yamada et al. | 257/197 |
| 2006/0249752 A1 * | 11/2006 | Asano | 257/197 |
| 2007/0158685 A1 * | 7/2007 | Moriya | 257/192 |
| 2007/0278523 A1 * | 12/2007 | Lin et al. | 257/194 |
| 2008/0001139 A1 * | 1/2008 | Augusto | 257/13 |
| 2008/0023725 A1 * | 1/2008 | Cooke et al. | 257/192 |
| 2008/0026545 A1 * | 1/2008 | Cooke et al. | 438/478 |
| 2008/0050883 A1 * | 2/2008 | Enicks | 438/312 |
| 2008/0230806 A1 * | 9/2008 | Pan et al. | 257/195 |
| 2012/0025268 A1 * | 2/2012 | Ichikawa | 257/192 |
| 2012/0068224 A1 * | 3/2012 | Nishikawa et al. | 257/183 |
| 2012/0175681 A1 * | 7/2012 | Stevens et al. | 257/195 |
| 2012/0326211 A1 * | 12/2012 | Stevens et al. | 257/195 |

FOREIGN PATENT DOCUMENTS

| | | |
|---|---|---|
| JP | 06-104290 A | 4/1994 |
| JP | 09-082898 A | 3/1997 |
| JP | 2001-176880 A | 6/2001 |
| JP | 2002-134416 A | 5/2002 |
| JP | 2005-159112 A | 6/2005 |
| JP | 2007-042936 A | 2/2007 |

OTHER PUBLICATIONS

D. Cheskis et al., "Co-Integration of GaAlAs/GaAs HBTs and GaAs FETs with a Simple, Manufacturable Process", IEDM 92-91, IEEE, 1992, pp. 4.6.2-4.6.4.

K. Itakura et al., "A BaAs BiFET Technology for Large Scale Integration", IEDM 89-389, IEEE, 1989, pp. 15.2.1-15.2.4.

First Office Action issued Jul. 1, 2013 in Chinese Patent Application No. 201080021283.8 to Sumitomo Chemical Co., Ltd., with English translation.

Notice of Reasons for Rejection dated Jun. 24, 2014 in Japanese Patent Application No. 2010-118588 with English translation.

* cited by examiner

SEMICONDUCTOR WAFER, METHOD OF PRODUCING SEMICONDUCTOR WAFER, AND ELECTRONIC DEVICE

CROSS REFERENCE TO RELATED APPLICATION

The contents of the following Japanese Patent Application and PCT patent application are incorporated herein by reference:
 JP2009-126761 filed on May 26, 2009, and
 PCT/JP2010/003369 filed on May 19, 2010.

BACKGROUND

1. Technical Field

The present invention relates to a semiconductor wafer, a method of producing a semiconductor wafer, and an electronic device.

2. Related Art

In recent years, electronic devices have achieved increasingly higher integration. Thus, a method has been proposed that forms a heterojunction bipolar transistor (HBT) and a field-effect transistor (FET) on the same wafer. IEDM Tech. Dig., 1992, p. 91 discloses that the emitter layer of an HBT may be used as the channel layer of an FET. IEDM Tech. Dig., 1989, p. 389 discloses that semiconductors used to form an AlGaAs/GaAs-based HBT may be stacked on semiconductors used to form a high electron mobility transistor (HEMT).

In a highly integrated electronic device, each electronic element may exhibit low performance since a plurality of semiconductor devices formed on the same wafer affect each other. For example, the performance of an HBT is improved preferably by increasing the conductivity of the collector by forming a subcollector layer having more impurities implanted therein. As the concentration of impurity atoms implanted in a semiconductor layer increases, however, the crystal structure of the semiconductor layer becomes unstable and crystal defects may be induced in the semiconductor layer. The defects may propagate into other semiconductor layers and grow therein.

For example, as the concentration of impurity atoms increases in the subcollector layer of a HBT, resulting crystal defects propagate into an FET, which is formed below the HBT, and degrade the performance of the FET. In light of the above, an object of the innovations herein related to the present invention is to provide a semiconductor wafer that can be used to form high-performance transistors by increasing the concentration of impurity atoms in a semiconductor layer formed in the semiconductor wafer with it being possible to reduce the crystal defects that may propagate into other semiconductor layers formed in the same semiconductor wafer.

SUMMARY

The inventors of the present invention have attempted to accomplish the above-described object and found that the concentration of given impurity atoms in a semiconductor layer can be raised with it being possible to maintain the stable crystal structure of the semiconductor layer and to prevent crystal defects from being induced, by doping the semiconductor layer further with different impurity atoms that are selected such that the Fermi level of the semiconductor layer containing both of the former and latter impurity atoms is closer to the Fermi level of the semiconductor layer containing neither the former nor latter impurity atoms, than the Fermi level of the semiconductor layer containing the former impurity atoms is. For a variety of semiconductors, a charge neutrality level can be defined in the vicinity of the middle of the forbidden band. At the charge neutrality level, the electrons are equally likely to be trapped and released. As the concentration of given impurity atoms increases in a semiconductor layer, the Fermi level of the semiconductor layer moves away from the charge neutrality level and closer to the conduction or valence band, so that the crystal structure of the semiconductor layer becomes unstable. However, if the semiconductor layer contains different impurity atoms in addition to the given impurity atoms, the Fermi level of the semiconductor layer moves away from the conduction or valence band and back towards the charge neutrality level, so that the crystal structure is stabilized.

For a solution to the above-mentioned problems, according to the first aspect related to the present invention, provided is one exemplary semiconductor wafer including a first semiconductor, and a second semiconductor formed directly or indirectly on the first semiconductor. Here, the second semiconductor contains a first impurity atom that exhibits p-type conductivity or n-type conductivity, and a second impurity atom that is selected such that the Fermi level of the second semiconductor containing both the first and second impurity atoms is closer to the Fermi level of the second semiconductor containing neither the first impurity atom nor the second impurity atom, than the Fermi level of the second semiconductor containing the first impurity atom is. For example, the majority carrier of the second semiconductor is an electron, and the Fermi level of the second semiconductor containing the first and second impurity atoms is lower than the Fermi level of the second semiconductor containing the first impurity atom. The second semiconductor may be a Group 3-5 compound semiconductor, and the second impurity atom may be at least one member selected from the group consisting of beryllium, boron, carbon, magnesium, and zinc.

The electron concentration of the second semiconductor is, for example, not lower than $1 \times 10^{18}$ cm$^{-3}$ and not higher than $6 \times 10^{18}$ cm$^{-3}$. The electron concentration of the second semiconductor may be, for example, not lower than $2 \times 10^{18}$ cm$^{-3}$ and not higher than $6 \times 10^{18}$ cm$^{-3}$. The concentration of the second impurity atom is, for example, not lower than $5 \times 10^{17}$ cm$^{-3}$ and not higher than $1 \times 10^{19}$ cm$^{-3}$.

In the above-described semiconductor wafer, the first semiconductor may be a Group 3-5 compound semiconductor, and the semiconductor wafer may further include an intermediate layer that is formed between the first semiconductor and the second semiconductor and made of $Al_xGa_{1-x}As$ (0≤x≤1) or $Al_yIn_zGa_{1-y-z}P$ (0≤y≤1, 0≤z≤1). The intermediate layer may include a stack having a $Al_pGa_{1-p}As$ layer and a $Al_qGa_{1-q}As$ layer (0≤p≤1, 0≤q≤1, p<q) stacked on one another. The first semiconductor may include an intrinsic semiconductor. The first semiconductor may include a stack having an n-type semiconductor and a p-type semiconductor stacked on one another.

According to the second aspect related to the present invention, provided is one exemplary electronic device comprising a transistor that includes a control terminal that controls a current flowing through the first semiconductor of the above-described semiconductor wafer. The electronic device may further include a third semiconductor that is formed between the first semiconductor and the second semiconductor and is lower in electron affinity than the first semiconductor. The transistor may be a field-effect transistor that uses, as a channel, a two-dimensional carrier gas formed on the first-semiconductor side with respect to a heterointerface between the third semiconductor and the first semiconductor. For example, the concentration of the two-dimensional carrier gas of the field-effect transistor is not lower than $1 \times 10^{11}$ cm$^{-2}$ and not higher than $5 \times 10^{12}$ cm$^{-2}$.

The electronic device may further include a fourth semiconductor that is epitaxially grown directly or indirectly on the second semiconductor and contains an impurity that exhibits a first conductivity type that is the same as the conductivity type exhibited by the impurity contained in the second semiconductor, where the concentration of the impurity contained in the fourth semiconductor is lower than the concentration of the impurity contained in the second semiconductor, a fifth semiconductor that is epitaxially grown directly or indirectly on the fourth semiconductor and contains an impurity that exhibits a second conductivity type that is opposite to the first conductivity type, a sixth semiconductor that is epitaxially grown directly or indirectly on the fifth semiconductor and contains an impurity that exhibits the first conductivity type, and a heterojunction bipolar transistor that has a subcollector formed in the second semiconductor, a collector formed in the fourth semiconductor, a base formed in the fifth semiconductor, and an emitter formed in the sixth semiconductor.

According to the third aspect related to the present invention, provided is one exemplary method of producing a semiconductor wafer, the method including forming a first semiconductor, and forming a second semiconductor directly or indirectly on the first semiconductor. Here, the second semiconductor contains a first impurity atom that exhibits p-type conductivity or n-type conductivity, and a second impurity atom that is selected such that the Fermi level of the second semiconductor containing both the first and second impurity atoms is closer to the Fermi level of the second semiconductor containing neither the first impurity atom nor the second impurity atom, than the Fermi level of the second semiconductor containing the first impurity atom is.

The method of producing a semiconductor wafer may further include epitaxially growing a fourth semiconductor directly or indirectly on the second semiconductor, the fourth semiconductor containing an impurity that exhibits a first conductivity type that is the same as the conductivity type of the impurity contained in the second semiconductor, epitaxially growing a fifth semiconductor directly or indirectly on the fourth semiconductor, the fifth semiconductor containing an impurity that exhibits a second conductivity type opposite to the first conductivity type, and epitaxially growing a sixth semiconductor directly or indirectly on the fifth semiconductor, the sixth semiconductor that exhibits the first conductivity type. The concentration of the impurity that exhibits the first conductivity type contained in the fourth semiconductor may be lower than the concentration of the impurity that exhibits the first conductivity type contained in the second semiconductor.

According to the above-described method of producing a semiconductor wafer, the second semiconductor may be an n-type Group 3-5 compound semiconductor, and during the formation of the second semiconductor, the Group 3-5 compound semiconductor may be epitaxially grown on the first semiconductor in a molar supply ratio of a Group 5 source to a Group 3 source being adjusted to fall within a range of from 1 to 6.

DESCRIPTION OF EXEMPLARY EMBODIMENTS

Figure 1:
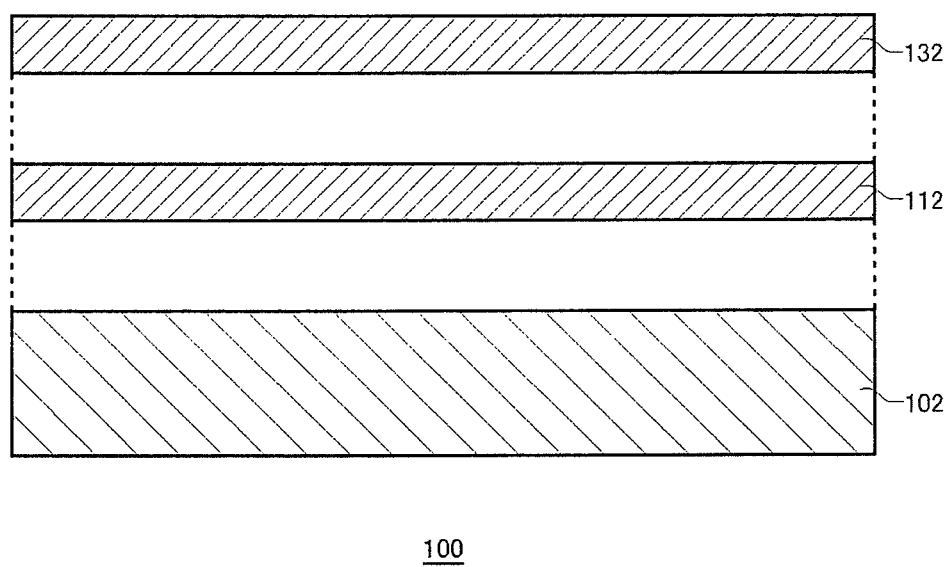
FIG. 1 illustrates an exemplary cross-section of a semiconductor wafer 100.

FIG. 1 illustrates an exemplary cross-section of a semiconductor wafer 100. The semiconductor wafer 100 includes a base wafer 102, a first semiconductor 112 and a second semiconductor 132. The base wafer 102 is, for example, a wafer having a sufficient mechanical strength to support the other constituents of the semiconductor wafer 100. When the first semiconductor 112 has a mechanical strength to support the second semiconductor 132, the semiconductor wafer 100 may not need to include the base wafer 102.

The base wafer 102 is, for example, a Si wafer, a silicon-on-insulator (SOI) wafer, a Ge wafer, or a germanium-on-insulator (GOI) wafer. The base wafer 102 may be a Group 3-5 compound semiconductor wafer such as a GaAs wafer. The base wafer 102 may be a sapphire wafer, a glass wafer, or a resin wafer such as a PET film.

The first semiconductor 112 is, for example, an intrinsic semiconductor. When a transistor is formed in the semiconductor wafer 100, the first semiconductor 112 can function as a region that allows currents, which are controlled by the control terminals of the transistor, to flow therethrough. For example, when the transistor is a field-effect transistor, the first semiconductor 112 functions as a channel layer that allows currents to flow between the source and the drain.

The first semiconductor 112 may contain a two-dimensional carrier gas. When a transistor is formed in the semiconductor wafer 100, currents flow through the two-dimensional carrier gas. The concentration of the two-dimensional carrier gas is preferably not lower than $1\times10^{11}$ cm$^{-2}$ and not higher than $5\times10^{12}$ cm$^{-2}$.

The first semiconductor 112 is, for example, a Group 3-5 compound semiconductor. For example, the first semiconductor 112 is InGaAs. The first semiconductor 112 is formed directly or indirectly on the base wafer 102 by an epitaxial growth method, for example.

The second semiconductor 132 is formed directly or indirectly on the first semiconductor 112. The second semiconductor 132 is, for example, formed by epitaxial growth on the first semiconductor 112. The second semiconductor 132 may be formed by epitaxial growth on a different layer that is disposed on the first semiconductor 112. The second semiconductor 132 is, for example, a Group 3-5 compound semiconductor. The second semiconductor 132 is, for example, GaAs, AlGaAs, InP, InGaAs, or GaN.

The second semiconductor 132 contains a first impurity atom that exhibits p- or n-type conductivity. The second semiconductor 132 also contains a second impurity atom that is selected such that the Fermi level of the second semiconductor 132 containing both the first and second impurity atoms is closer to the Fermi level of the second semiconductor 132 containing neither the first impurity atom nor the second impurity atom, than the Fermi level of the second semiconductor 132 containing the first impurity atom is. Stated differently, the second impurity atom is selected to reduce the difference between the charge neutrality level and the Fermi level of the second semiconductor 132 containing the first impurity atom.

For example, when the second semiconductor 132 is doped with an n-type-conductivity first impurity atom, the majority carriers of the second semiconductor 132 are electrons. When the majority carriers of the second semiconductor 132 are electrons, the second impurity atom is selected so as to lower the Fermi level of the second semiconductor 132 that has been doped with the first impurity atom. Lowering the Fermi level of the second semiconductor 132 can reduce the crystal defects that may result from the difference in Fermi level between the second semiconductor 132 and the first semiconductor 112.

Specifically speaking, when the second semiconductor 132 is a Group 3-5 compound semiconductor, it is necessary to raise the electron concentration of the second semiconductor 132 by doping the second semiconductor 132 with a first impurity atom that exhibits n-type conductivity such as an Si atom, in order to use the second semiconductor 132 as the subcollector of an HBT. For example, the electron concentration of the second semiconductor 132 is preferably not lower than $2\times10^{18}$ cm$^{-3}$ and not higher than $6\times10^{18}$ cm$^{-3}$. The electron concentration of the second semiconductor 132 may be not lower than $1\times10^{18}$ cm$^{-3}$ and not higher than $6\times10^{18}$ cm$^{-3}$.

However, the higher electron concentration results in a higher Fermi level. As a result, the difference between the Fermi level and the charge neutrality level of the second semiconductor 132 increases, the crystal structure of the second semiconductor 132 thus becomes unstable, and crystal defects occur in the second semiconductor 132.

Therefore, the difference between the Fermi level and the charge neutrality level of the second semiconductor 132 can be made smaller by doping the second semiconductor 132 with the second impurity atom that lowers the Fermi level of the second semiconductor 132 containing the first impurity atom. For example, when the first impurity atom is of the n-type conductivity, the second impurity atom is of the opposite conductivity, in other words, the p-type conductivity. For example, when the second semiconductor 132 is a Group 3-5 compound semiconductor, the second impurity atom is at least one member selected from the group consisting of beryllium, boron, carbon, magnesium, and zinc. The concentration of the second impurity atom is preferably not lower than $5\times10^{17}$ cm$^{-3}$ and not higher than $1\times10^{19}$ cm$^{-3}$.

In FIG. 1, the dotted lines indicate that other semiconductors and constituents may be provided in the regions defined by the dotted lines as needed. For example, the semiconductor wafer 100 includes a carrier-supplying semiconductor, a spacer semiconductor, a buffer semiconductor, or the like between the base wafer 102 and the first semiconductor 112. The semiconductor wafer 100 may also include a carrier-supplying semiconductor, a spacer semiconductor, a buffer semiconductor or the like between the first semiconductor 112 and the second semiconductor 132.

Figure 2:
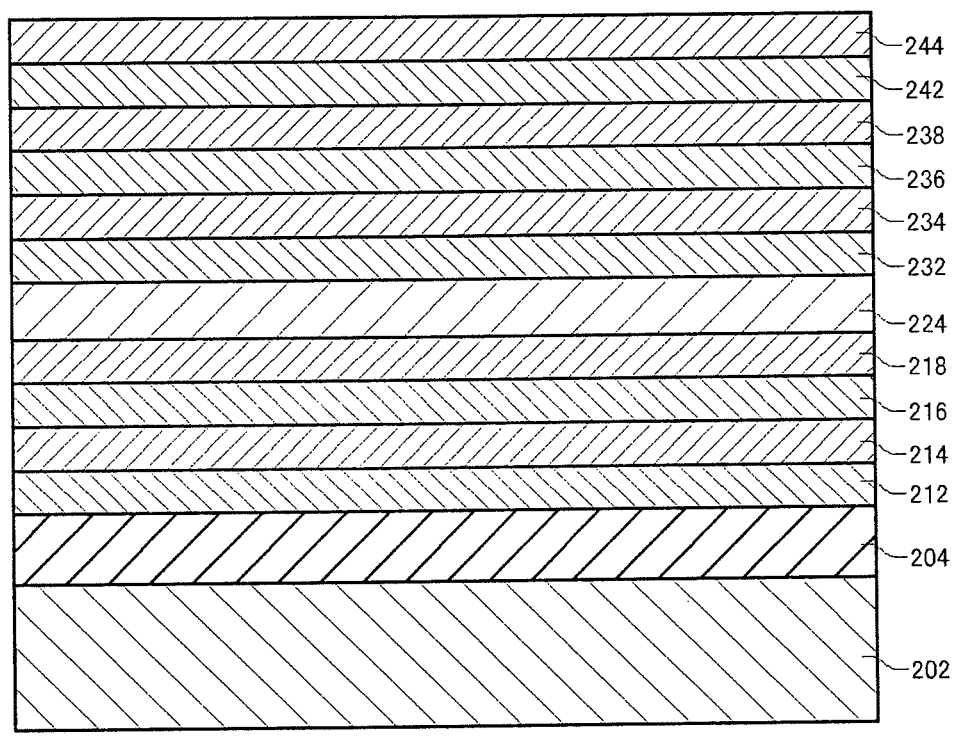
FIG. 2 illustrates an exemplary cross-section of a semiconductor wafer 200.

FIG. 2 illustrates an exemplary cross-section of a semiconductor wafer 200. The semiconductor wafer 200 includes a base wafer 202, a buffer semiconductor 204, a channel semiconductor 212, a carrier-supplying semiconductor 214, a barrier-forming semiconductor 216, a contact semiconductor 218, an intermediate semiconductor 224, a subcollector semiconductor 232, a collector semiconductor 234, a base semiconductor 236, an emitter semiconductor 238, a subemitter semiconductor 242, and an emitter contact semiconductor 244.

The channel semiconductor 212, the carrier-supplying semiconductor 214, the barrier-forming semiconductor 216, and the contact semiconductor 218 form a semiconductor structure layer that is to constitute a HEAT in the semiconductor wafer 100 (hereinafter, referred to as "the HEMT semiconductor structure layer"). The subcollector semiconductor 232, the collector semiconductor 234, the base semiconductor 236, the emitter semiconductor 238, the subemitter semiconductor 242, and the emitter contact semiconductor 244 form a semiconductor structure layer that is to constitute a HBT in the semiconductor wafer 100 (hereinafter, referred to as "the HBT semiconductor structure layer").

The base wafer 202 corresponds to the base wafer 102 of the semiconductor wafer 100. The channel semiconductor 212 corresponds to the first semiconductor 112. The subcollector semiconductor 232 corresponds to the second semiconductor 132. In the following, the constituents of the semiconductor wafer 200 that are equivalent to the already-explained constituents of the semiconductor wafer 100 may not be described.

The buffer semiconductor 204 is a semiconductor layer that is provided to assure high crystal quality for the channel semiconductor 212. For example, the buffer semiconductor 204 prevents the impurity atom left on the surface of the base wafer 202 from degrading the characteristics of the one or more semiconductor elements to be formed on the base wafer 202. The buffer semiconductor 204 may reduce the leakage current from the channel semiconductor 212. The buffer semiconductor 204 may serve as a buffer layer that achieves a match in terms of lattice constant between the channel semiconductor 212 and the base wafer 202. The buffer semiconductor 204 can be made of, for example, a Group 3-5 compound semiconductor.

The buffer semiconductor 204 is, for example, formed by an epitaxial growth method so as to be in contact with the base wafer 202. The semiconductor wafer 200 may further include one or more other semiconductor layers between the buffer semiconductor 204 and the base wafer 202. The buffer semiconductor 204 may be a single semiconductor layer or constituted by a plurality of semiconductor layers. For example, the buffer semiconductor 204 is constituted by a plurality of semiconductor layers of different compositions.

The buffer semiconductor 204 may have a carrier trap. An example of the carrier trap is a boron atom or an oxygen atom. The buffer semiconductor 204 is, for example, a compound semiconductor $Al_mGa_{1-x}As$ ($0 \leq x \leq 1$) or $Al_yIn_zGa_{1-x-y}$ ($0 \leq y \leq 1$, $0 \leq z \leq 1$) having an oxygen atom added thereto as a carrier trap. The addition of the carrier trap such as an oxygen atom to the compound semiconductor can form a deep-level trap in the compound semiconductor. The depp-level trap traps carriers passing through the buffer semiconductor 204. Thus, the buffer semiconductor 204 can prevent the leakage current from flowing between a semiconductor layer formed on the buffer semiconductor 204 and the base wafer 202 positioned below the buffer semiconductor 204.

The buffer semiconductor 204 may include a plurality of p-type Group 3-5 compound semiconductors. The two adjacent Group 3-5 compound semiconductors of these Group 3-5 compound semiconductors may form at least one heterojunction selected from the group consisting of a heterojunction between $Al_xGa_{1-x}As$ ($0 \leq x \leq 1$) and $Al_yGa_{1-y}As$ ($0 \leq y \leq 1$, $x<y$), a heterojunction between $Al_pIn_qGa_{1-p-q}$ ($0 \leq p \leq 1$, $0 \leq q \leq 1$) and $Al_rIn_sGa_{1-r-s}P$ ($0 \leq r \leq 1$, $0 \leq s \leq 1$, $p<r$), and a heterojunction between $Al_xGa_{1-x}As$ ($0 \leq x \leq 1$) and $Al_pIn_qGa_{1-p-q}P$ ($0 \leq p \leq 1$, $0 \leq q \leq 1$).

For example, when the buffer semiconductor 204 is constituted by a p-type semiconductor layer that is in contact with the channel semiconductor 212 and made of $Al_xGa_{1-x}As$ ($0 \leq x \leq 1$) and a p-type semiconductor layer that is in contact with the base wafer 202 and made of $Al_yGa_{1-y}As$ ($0 \leq y \leq 1$) and $x<y$, the p-type semiconductor layer made of $Al_yGa_{1-y}As$ has a higher Al proportion and a wider energy band gap than the p-type semiconductor layer made of $Al_xGa_{1-x}As$. The difference in band gap serves as an energy barrier and prevents carriers from moving from the p-type semiconductor layer made of $Al_xGa_{1-x}As$ to the p-type semiconductor layer made of $Al_yGa_{1-y}As$. Thus, leakage current can be prevented.

The buffer semiconductor 204 may be constituted by more p-type semiconductor layers. Each of the layers constituting the buffer semiconductor 204 may have a thickness on the order of atoms so that the buffer semiconductor 204 as a whole may form a superlattice. When the buffer semiconductor 204 is constituted by a large number of layers as discussed above, a large number of heterojunctions form a large number of energy barriers, so that leakage current can be prevented more effectively.

The buffer semiconductor 204 may be formed by a plurality of p-type semiconductor layers and a plurality of n-type semiconductor layers and have a multilayer structure in which the p-type semiconductor layers and the n-type semiconductor layers are alternately stacked to form a plurality of PN junctions. The PN junctions form a plurality of depleted regions and prevent carriers from moving therethrough. Thus, leakage current can be effectively prevented.

The channel semiconductor 212 corresponds to the first semiconductor 112. The channel semiconductor 212 is, for example, formed so as to be in contact with the buffer semiconductor 204. The semiconductor wafer 200 may further include other semiconductors and constituents between the channel semiconductor 212 and the buffer semiconductor 204. For example, the semiconductor wafer 200 further includes a carrier-supplying semiconductor or a spacer semiconductor between the channel semiconductor 212 and the buffer semiconductor 204.

The carrier-supplying semiconductor 214 supplies the channel semiconductor 212 with carriers. The carrier-supplying semiconductor 214 is, for example, formed between the channel semiconductor 212 and the subcollector semiconductor 232. The semiconductor wafer 200 may further include other semiconductors and constituents between the carrier-supplying semiconductor 214 and the channel semiconductor 212. For example, the semiconductor wafer 200 further includes a spacer semiconductor between the carrier-supplying semiconductor 214 and the channel semiconductor 212.

The carrier-supplying semiconductor 214 may be lower in electron affinity than the channel semiconductor 212. The carrier-supplying semiconductor 214 is a Group 3-5 compound semiconductor. For example, the carrier-supplying semiconductor 214 can be AlGaAs. The carrier-supplying semiconductor 214 is, for example, formed on the channel semiconductor 212 by an epitaxial growth Method.

The carrier-supplying semiconductor 214 forms a heterojunction with the channel semiconductor 212. At the heterojunction interface, a two-dimensional carrier gas may be formed. The concentration of the two-dimensional carrier gas may be not lower than $1 \times 10^{11}$ cm$^{-2}$ and not higher than $5 \times 10^{12}$ cm$^{-2}$, preferably not lower than $1 \times 10^{12}$ cm$^{-2}$ and not higher than $3 \times 10^{12}$ cm$^{-2}$.

The barrier-forming semiconductor 216 forms an energy barrier between a control electrode and the two-dimensional carrier gas. For example, the control electrode is made of metal, and the Schottky contact between the barrier-forming semiconductor 216 and the metal forms an energy barrier. The barrier-forming semiconductor 216 is, for example, a Group 3-5 compound semiconductor. The barrier-forming semiconductor 216 is, for example, made of AlGaAs. The barrier-forming semiconductor 216 is, for example, formed on the channel semiconductor 212 by an epitaxial growth method. The semiconductor wafer 200 may be constituted without the barrier-forming semiconductor 216, in which case the carrier-supplying semiconductor 214 serves as a barrier-forming semiconductor.

The contact semiconductor 218 forms an ohmic contact with a metal electrode that is formed so as to be in contact with the contact semiconductor 218. The contact semiconductor 218 is, for example, a Group 3-5 compound semiconductor. The contact semiconductor 218 is, for example, made of GaAs or InGaAs. The contact semiconductor 218 is, for example, formed on the barrier-forming semiconductor 216 by an epitaxial growth method.

The intermediate semiconductor 224 is, for example, formed between the channel semiconductor 212 and the subcollector semiconductor 232. The intermediate semiconductor 224 may be formed on the contact semiconductor 218. The intermediate semiconductor 224 can preferably assure etching selectivity between the intermediate semiconductor 224 and the subcollector semiconductor 232. The intermediate semiconductor 224 is, for example, a Group 3-5 compound semiconductor. The intermediate semiconductor 224 is, for example, InGaP.

The intermediate semiconductor 224 may include $Al_xGa_{1-x}As$ ($0 \leq x \leq 1$) or $Al_yIn_zGa_{1-y-z}P$ ($0 \leq y \leq 1$, $0 \leq z \leq 1$). The intermediate semiconductor 224 may include a stack formed by stacking an $Al_pGa_{1-p}As$ layer and an $Al_qGa_{1-q}As$ layer ($0 \leq p \leq 1$, $0 \leq q \leq 1$, $p<q$) on one another. The stack may include $Al_pGa_{1-p}As$ layers and $Al_qGa_{1-q}As$ layers ($0 \leq p \leq 1$, $0 \leq q \leq 1$, $p<q$) that repeatedly alternate with each other. The intermediate semiconductor 224 is, for example, formed by an epitaxial growth method.

The subcollector semiconductor 232 corresponds to the second semiconductor 132. Specifically speaking, the subcollector semiconductor 232 has a sufficient electron concentration to serve as the subcollector layer of a HBT. The subcollector semiconductor 232 is, for example, a Group 3-5 compound semiconductor that is highly doped with a first impurity atom that exhibits n-type conductivity, such as an Si atom. The electron concentration of the subcollector semiconductor 232 is, for example, not lower than $2\times10^{18}$ cm$^{-3}$ and not higher than $6\times10^{18}$ cm$^{-3}$. The electron concentration of the subcollector semiconductor 232 may be not lower than $1\times10^{18}$ cm$^{-3}$ and not higher than $6\times10^{18}$ cm$^{-3}$.

The subcollector semiconductor 232 also contains a second impurity atom that is selected such that the Fermi level of the subcollector semiconductor 232 containing both the first and second impurity atoms is closer to the Fermi level of the subcollector semiconductor 232 containing neither the first impurity atom such as a Si atom nor the second impurity atom, than the Fermi level of the subcollector semiconductor 232 containing the first impurity atom such as Si atom is. Stated differently, the subcollector semiconductor 232 contains a second impurity atom that reduces the difference between the charge neutrality level and the Fermi level of the subcollector semiconductor 232 containing the first impurity atom. The second impurity atom is at least one member selected from the group consisting of beryllium, boron, carbon, magnesium, and zinc. The concentration of the second impurity atom is, for example, not lower than $5\times10^{17}$ cm$^{-3}$ and not higher than $1\times10^{19}$ cm$^{-3}$.

The addition of the second impurity atom to the subcollector semiconductor 232 in the HBT semiconductor structure layer can prevent crystal defects from occurring in the subcollector semiconductor 232 and also prevent such crystal defects from propagating into the layer positioned below the subcollector semiconductor 232. Thus, the characteristics of the HEMT semiconductor structure layer, which is positioned below the HBT semiconductor structure layer, can be prevented from degrading. For example, unevenness of the threshold voltage of the HEMT can be prevented.

The collector semiconductor 234 is formed on the subcollector semiconductor 232. The collector semiconductor 234 may contain an impurity atom that exhibits the same conductivity type as the impurity atom contained in the subcollector semiconductor 232. The concentration of the impurity atom contained in the collector semiconductor 234 may be lower than the concentration of the impurity atom contained in the subcollector semiconductor 232.

The collector semiconductor 234 is, for example, a Group 3-5 compound semiconductor. The collector semiconductor 234 is, for example, made of GaAs. The collector semiconductor 234 serves as the collector layer of a HBT, for example. The collector semiconductor 234 is, for example, formed by an epitaxial growth method.

The base semiconductor 236 is formed on the collector semiconductor 234. The base semiconductor 236 may contain an impurity atom that exhibits the opposite conductivity type to the impurity atom contained in the collector semiconductor 234. The base semiconductor 236 is, for example, a Group 3-5 compound semiconductor. The base semiconductor 236 is, for example, made of GaAs. The base semiconductor 236 serves as the base layer of a HBT. The base semiconductor 236 is formed by an epitaxial growth method, for example.

The emitter semiconductor 238 is formed on the base semiconductor 236. The emitter semiconductor 238 may contain an impurity atom that exhibits the same conductivity type as the impurity atom contained in the collector semiconductor 234. The emitter semiconductor 238 is a Group 3-5 compound semiconductor. The emitter semiconductor 238 is, for example, made of InGaP. The emitter semiconductor 238 serves as the emitter layer of a HBT. The emitter semiconductor 238 is formed by an epitaxial growth method, for example.

The subemitter semiconductor 242 is formed on the emitter semiconductor 238. The subemitter semiconductor 242 contains an impurity atom that exhibits the same conductivity type as the impurity atom contained in the emitter semiconductor 238, for example. The concentration of the impurity atom contained in the subemitter semiconductor 242 may be higher than the concentration of the impurity atom contained in the emitter semiconductor 238.

The subemitter semiconductor 242 is, for example, a Group 3-5 compound semiconductor. The subemitter semiconductor 242 is, for example, made of GaAs. The subemitter semiconductor 242 serves as the subemitter layer of a HBT, for example. The subemitter semiconductor 242 is formed by an epitaxial growth method, for example.

The emitter contact semiconductor 244 is formed on the subemitter semiconductor 242. The emitter contact semiconductor 244 contains an impurity atom that exhibits the same conductivity type as the impurity atom contained in the emitter semiconductor 238, for example. The concentration of the impurity atom contained in the emitter contact semiconductor 244 may be higher than the concentration of the impurity atom contained in the emitter semiconductor 238. The emitter contact semiconductor 244 may form an ohmic contact with a metal electrode formed so as to be in contact with the emitter contact semiconductor 244.

The emitter contact semiconductor 244 is, for example, a Group 3-5 compound semiconductor. The emitter contact semiconductor 244 is, for example, made of InGaAs. The emitter contact semiconductor 244 is formed by an epitaxial growth method, for example.

Figure 3:
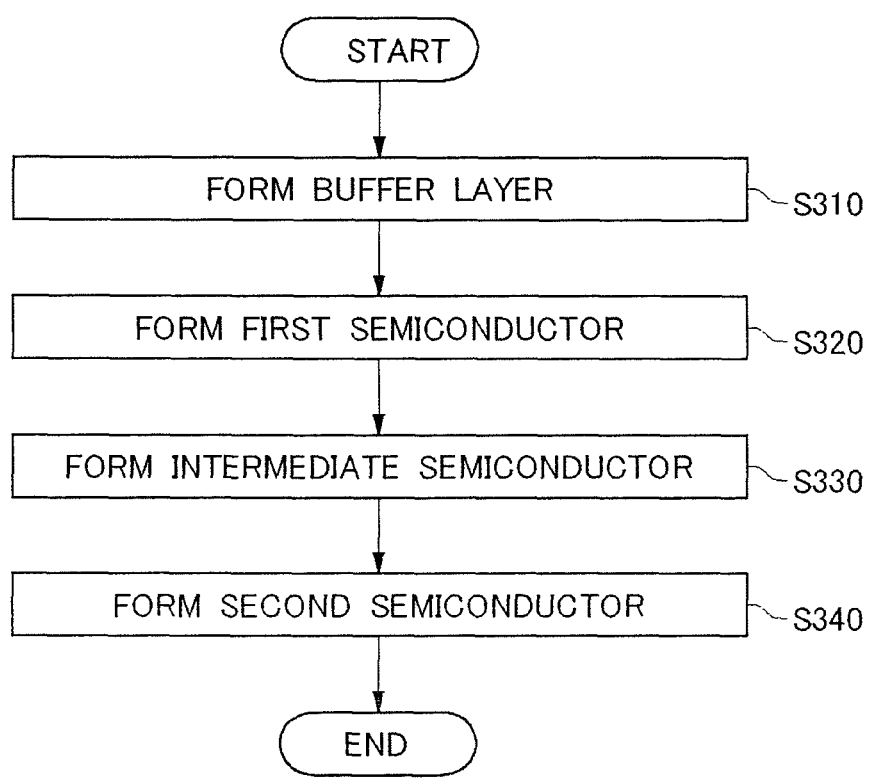
FIG. 3 is a flow chart illustrating an exemplary method of producing the semiconductor wafer 200.

FIG. 3 is a flow chart illustrating an exemplary method of producing the semiconductor wafer 200. The semiconductor wafer producing method relating to the present embodiment includes a step S310 of forming a buffer layer, a step S320 of forming a first semiconductor, a step S330 of forming an intermediate semiconductor, and a step S340 of forming a second semiconductor.

The semiconductor wafer 200 is produced by sequentially epitaxially growing the semiconductors constituting the semiconductor wafer 200 on the base wafer 202. The epitaxial growth method is, for example, metalorganic chemical vapor deposition (MOCVD), and molecular beam epitaxy (MBE). The following describes a method of producing the semiconductor wafer 200 using MOCVD.

In the step S310 of forming a buffer layer, the base wafer 202 is placed within a reaction furnace so that the buffer semiconductor 204 is epitaxially grown on the base wafer 202. The base wafer 202 is, for example, a high-resistivity semi-insulative GaAs single-crystal wafer. The base wafer 202 is, for example, a GaAs wafer that is produced using liquid encapsulated Czochralski (LEC), vertical Bridgman (VB), vertical gradient freeze (VGF). The base wafer 202 may be tilted by an angle of approximately 0.05° to 10° with respect to one crystallographic plane orientation. Preferably, the base wafer 202 is tilted by an angle not less than 0.3° and not more than 0.5° with respect to one crystallographic plane orientation.

The buffer semiconductor 204 is, for example, i-type AlGaAs. To form the buffer semiconductor 204, the GaAs single-crystal base wafer 202 is placed on the heating stage of a MOCVD furnace after the surface of the GaAs single-crystal base wafer 202 is degreased, etched, cleaned by water and dried. The base wafer 202 starts to be heated after a sufficient amount of the atmosphere within the furnace is replaced with highly pure hydrogen. Once the temperature of the base wafer 202 is settled to an appropriate level, an arsenic source is introduced into the furnace and a gallium source and an aluminum source are subsequently introduced. In this way, the AlGaAs layer is epitaxially grown. During the crystal growth, the temperature of the wafer is, for example, not lower than 400° C. and not higher than 800° C.

As the Group 3 source, trimethylgallium (TMG) and trimethylaluminum (TMA) can be used. As the Group 5 source gas, arsine ($AsH_3$) or the like can be used. During the epitaxial growth, the pressure within the reaction furnace is set to 0.1 atm, the temperature is set to 650° C., and the growing rate is set to 1 to 3 μm/hr, for example. As the carrier gas for the sources, highly pure hydrogen can be used.

In the following step of forming a first semiconductor, the channel semiconductor 212, the carrier-supplying semiconductor 214, the barrier-forming semiconductor 216, and the contact semiconductor 218 are sequentially epitaxially grown on the buffer semiconductor 204. For example, the channel semiconductor 212 is i-type InGaAs. The carrier-supplying semiconductor 214 is n-type AlGaAs. The barrier-forming semiconductor 216 is n-type AlGaAs. The contact semiconductor 218 is highly-doped n-type GaAs.

As the Group 3 source, trimethylindium (TMI) may be used as well as the above-mentioned TMG and TMA. For example, the InGaAs channel semiconductor 212 is formed in the following manner. Once the temperature of the base wafer 202 is settled to an appropriate level, arsine is introduced into the furnace as an arsenic source, and TMG and TMI are subsequently introduced respectively as a gallium source and an indium source. In this manner, InGaAs can be epitaxially grown.

The impurity atom that exhibits the n-type conductivity is at least one member selected from the group consisting of Si, Se, Ge, Sn, Te and S. As a compound containing the impurity atom exhibiting the n-type conductivity, a hydride of the selected element or an alkyl compound having an alkyl group with a carbon number of 1 to 3 can be used. For example, Si may be selected as the impurity atom exhibiting the n-type conductivity, and silane ($SiH_4$) or disilane ($Si_2H_6$) may be used as the compound containing the impurity atom exhibiting the n-type conductivity. The concentration of the added impurity atom Si can be varied by adjusting the flow rate of silane or disilane during the epitaxial growth.

In the following step S330 of forming an intermediate semiconductor, the intermediate semiconductor 224 is epitaxially grown on the contact semiconductor 218. The intermediate semiconductor 224 is, for example, n-type InGaP. As the Group 5 source gas, phosphine ($PH_3$) may be used apart from the above-mentioned arsine. For example, the InGaP intermediate semiconductor 224 can be formed in the following manner. Once the temperature of the base wafer 202 is settled to an appropriate level, phosphine is introduced into the furnace as the phosphor source, and TMG and TMI are subsequently introduced respectively as the gallium source and the indium source. In this manner, InGaP can be epitaxially grown.

In the following step S340 of forming a second semiconductor, the subcollector semiconductor 232, the collector semiconductor 234, the base semiconductor 236, the emitter semiconductor 238, the subemitter semiconductor 242, and the emitter contact semiconductor 244 are sequentially epitaxially grown on the intermediate semiconductor 224.

The subcollector semiconductor 232 is, for example, n-type GaAs highly doped with a first impurity atom. The first impurity atom, which exhibits the n-type conductivity, is at least one element selected from the group consisting of Si, Se, Ge, Sn, Te, and S.

The subcollector semiconductor 232 also contains a second impurity atom that is selected such that the Fermi level of the subcollector semiconductor 232 containing both the first and second impurity atoms is closer to the Fermi level of the subcollector semiconductor 232 containing neither the first impurity atom nor the second impurity atom, than the Fermi level of the subcollector semiconductor 232 containing the first impurity atom is. For example, the subcollector semiconductor 232 contains a carbon atom as the second impurity atom that reduces the difference between the charge neutrality level and the Fermi level of the subcollector semiconductor 232 containing the first impurity atom. As the carbon source, a carbon halide such as $CBr_4$ or $BrCCl_3$ can be used, or the carbon contained in the Group 3 source can be used.

The amount of the carbon atom introduced into the subcollector semiconductor 232 can be controlled by adjusting the molar supply ratio of the Group 5 source to the Group 3 source that are introduced into the crystal growth furnace. For example, the amount of the carbon atom introduced into GaAs, which forms subcollector semiconductor 232, can be controlled by adjusting the molar supply ratio of arsine to trimethylgallium. Generally speaking, as the molar supply ratio of the Group 5 source to the Group 3 source decreases, the amount of the introduced carbon atom increases. The molar supply ratio of the Group 5 source to the Group 3 source is, for example, not lower than 1 and not higher than 6, preferably not lower than 1.6 and not higher than 6.

The collector semiconductor 234 is, for example, n-type GaAs. The base semiconductor 236 is, for example, p-type GaAs. As the source of the p-type impurity atom introduced into the base semiconductor 236, a carbon halide such as $CBr_4$ or $BrCCl_3$ can be used. The emitter semiconductor 238 is, for example, n-type InGaP. The subemitter semiconductor 242 is, for example, n-type GaAs highly doped with an impurity atom. The emitter contact semiconductor 244 is n-type InGaAs highly doped with an impurity atom.

Figure 4:
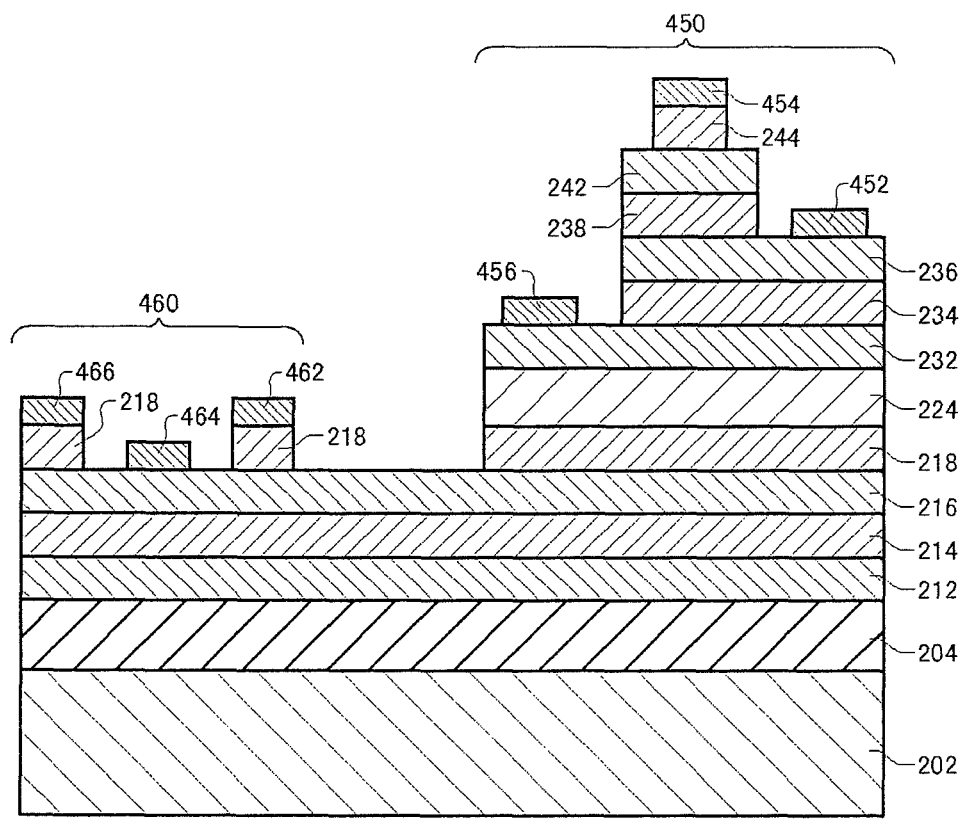
FIG. 4 illustrates an exemplary cross-section of an electronic device 400.
Figure 5:
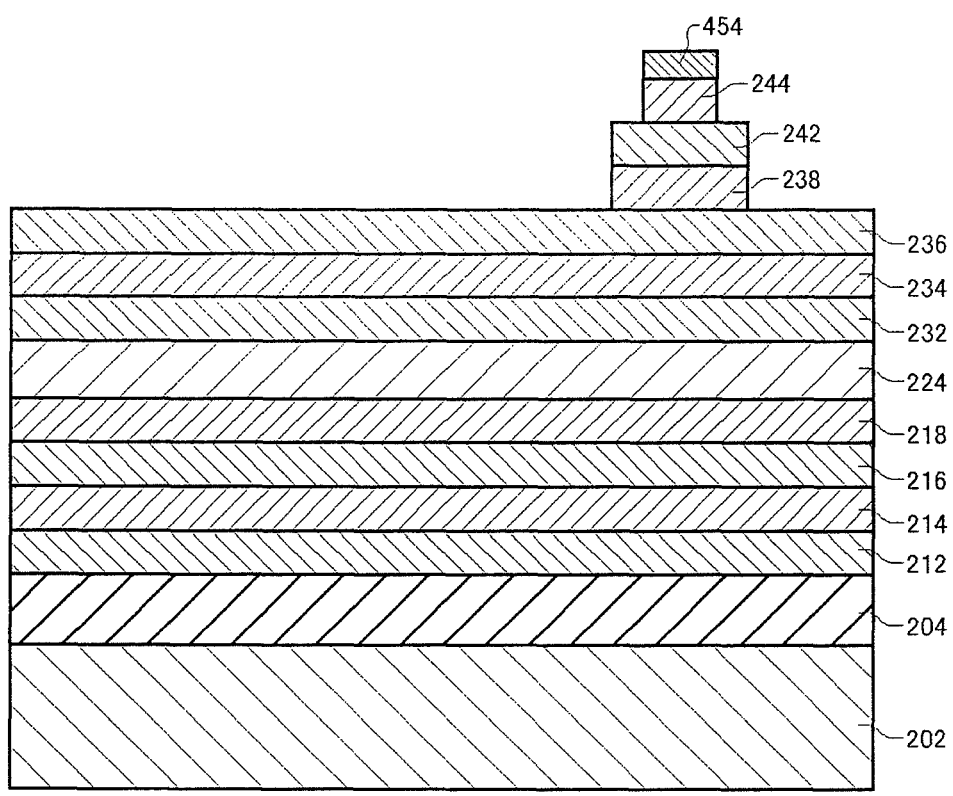
FIG. 5 illustrates an exemplary cross-section seen during the manufacturing process of the electronic device 400.

FIG. 4 illustrates an exemplary cross-section of en electronic device 400. The electronic device 400 includes the base wafer 202, the buffer semiconductor 204, the channel semiconductor 212, the carrier-supplying semiconductor 214, the barrier-forming semiconductor 216, the contact semiconductor 218, the intermediate semiconductor 224, the subcollector semiconductor 232, the collector semiconductor 234, the base semiconductor 236, the emitter semiconductor 238, the subemitter semiconductor 242, the emitter contact semiconductor 244, an HBT 450, and an HEMT 460. The electronic device 400 is produced using the semiconductor wafer 200 and has an HEMT and a HBT monolithically formed on the same wafer.

The HBT 450 includes a base electrode 452 formed on the base semiconductor 236, an emitter electrode 454 formed on the emitter contact semiconductor 244, and a collector electrode 456 formed on the subcollector semiconductor 232. The HEMT 460 includes a drain electrode 462 formed on the contact semiconductor 218, a gate electrode 464 formed on the barrier-forming semiconductor 216, and a source electrode 466 formed on the contact semiconductor 218.

FIGS. 5 to 8 illustrate exemplary cross-sections observed during the producing process of the electronic device 400. The following describes the method of producing the electronic device 400 with reference to the drawings. However, some of the steps that are common between the producing method of the semiconductor wafer 200 and the producing method of the electronic device 400 may not be described in the following.

To begin with, the emitter electrode 454 is formed in contact with the emitter contact semiconductor 244. For example, the emitter electrode 454 can be formed by forming, on the surface of the emitter contact semiconductor 244 using photolithography, a resist mask having an opening positioned to form the emitter electrode 454, depositing a metal to form the electrode, and then lifting off the resist. An emitter mesa may be formed by photolithography such as etching.

Figure 6:
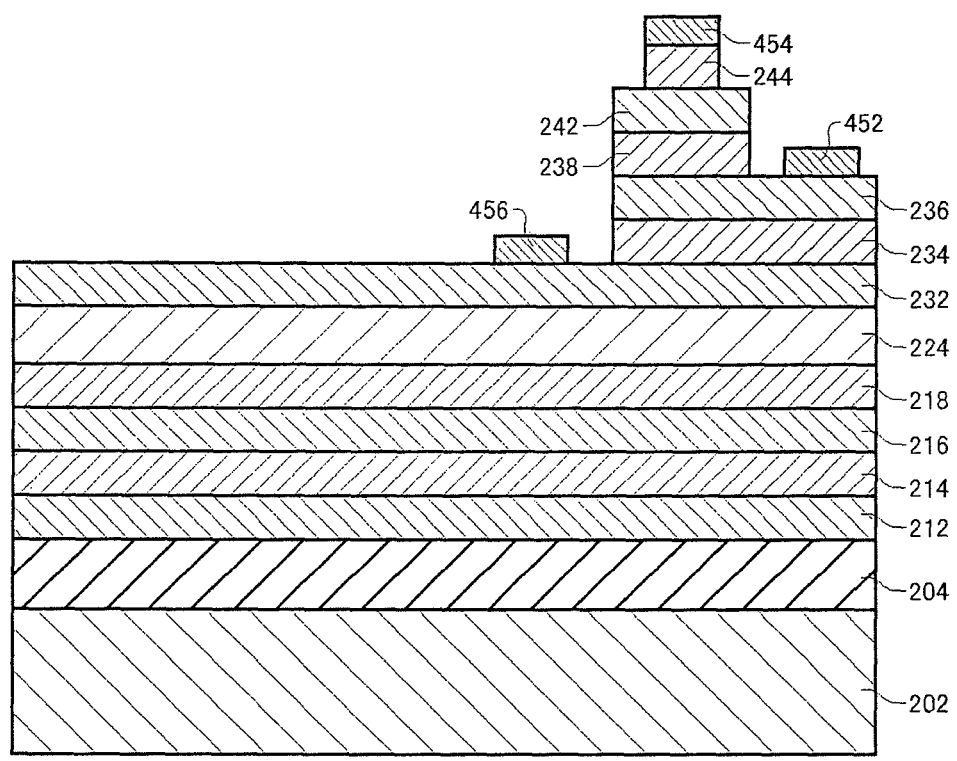
FIG. 6 illustrates an exemplary cross-section seen during the manufacturing process of the electronic device 400.

Following this, a collector mesa is formed using photolithography such as etching as shown in FIG. 6. Specifically speaking, the base electrode 452 is formed so as to be in contact with the base semiconductor 236, and the collector electrode 456 is formed so as to be in contact with the subcollector semiconductor 232. The base electrode 452 and the collector electrode 456 can be formed by forming using photolithography a resist mask that has an opening positioned to form the base electrode 452 or the collector electrode 456, depositing a metal to form the electrode, and then lifting off the resist.

Figure 7:
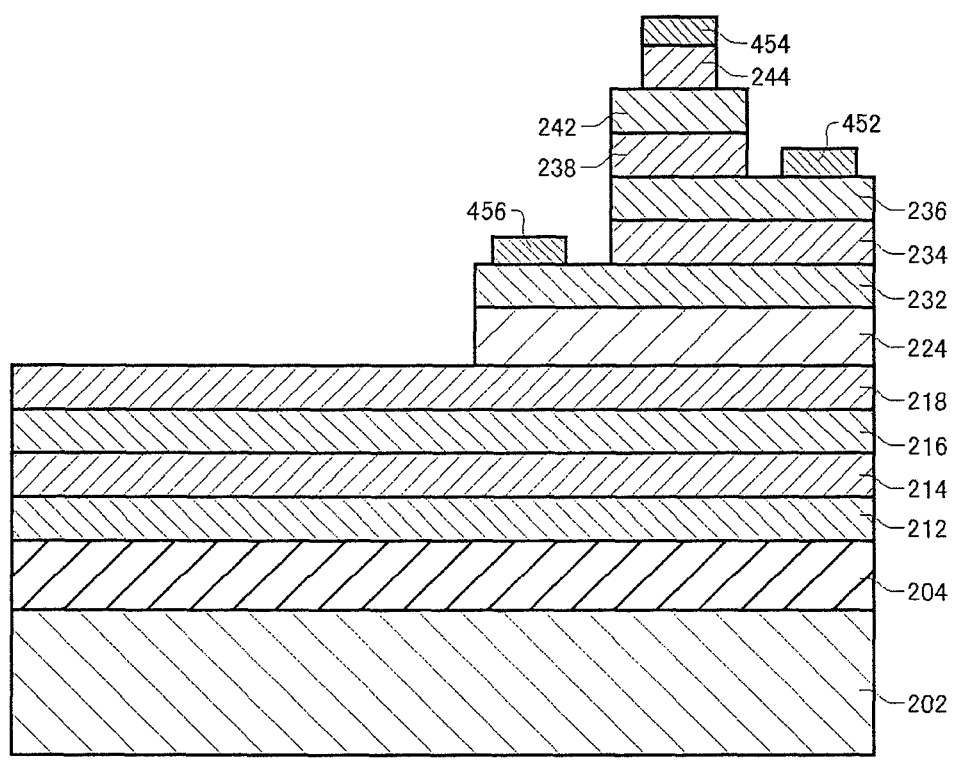
FIG. 7 illustrates an exemplary cross-section seen during the manufacturing process of the electronic device 400.
Figure 8:
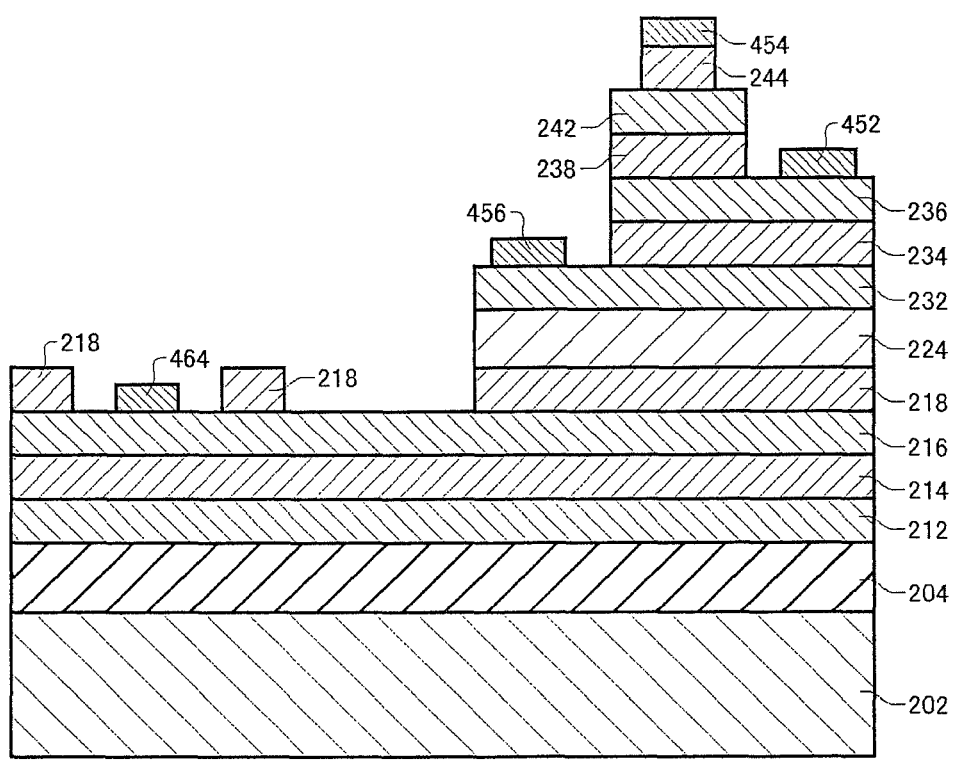
FIG. 8 illustrates an exemplary cross-section seen during the manufacturing process of the electronic device 400.

Subsequently, a portion of the HBT semiconductor in which the HEMT 460 is to be formed is removed by photolithography such as etching to externally expose the contact semiconductor 218 as shown in FIG. 7. Furthermore, a source portion and a drain portion are formed using photolithography such as etching, and the gate electrode 464 is formed so as to be in contact with the exposed barrier-forming semiconductor 216 as shown in FIG. 8. Lastly, the drain electrode 462 and the source electrode 466 are formed as shown in FIG. 4. In this manner, the electronic device 400 is completed. The above description is not made to limit the order of carrying out the steps of the producing process of the electronic device 400. For example, the emitter electrode 454 may be formed after the emitter mesa is formed.

Figure 9:
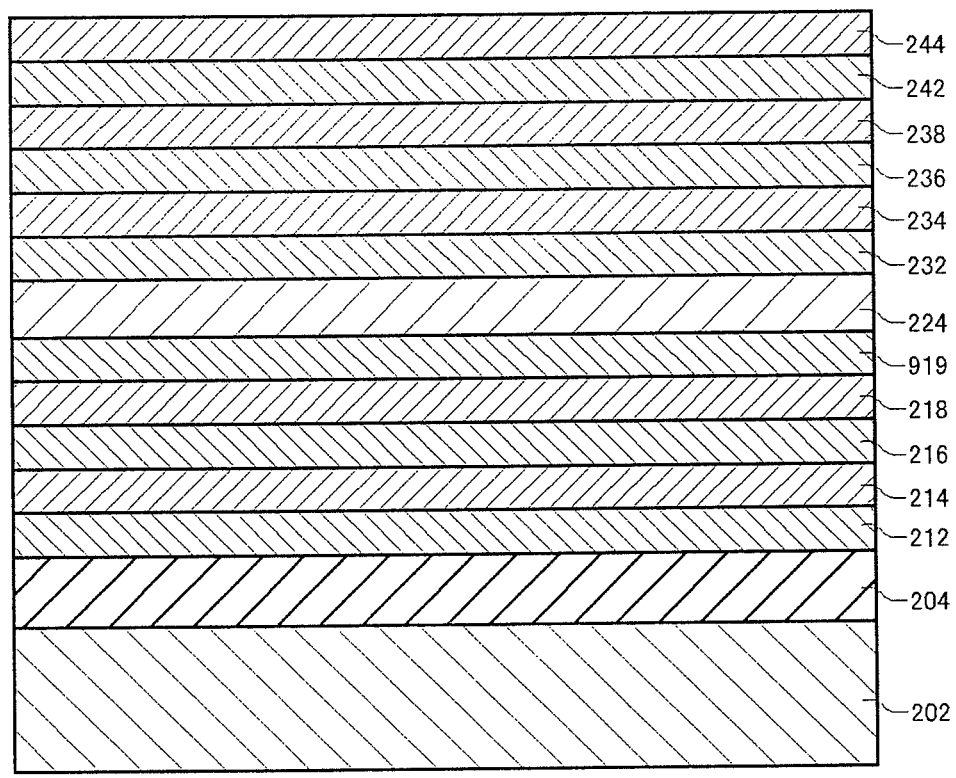
FIG. 9 illustrates an exemplary cross-section of a semiconductor wafer 900.

FIG. 9 illustrates an exemplary cross-section of a semiconductor wafer 900. The semiconductor wafer 900 is different from the semiconductor wafer 200 in that a semiconductor 919 is additionally provided between the contact semiconductor 218 and the intermediate semiconductor 224. The semiconductor 919 contains an impurity atom that exhibits the opposite conductivity type to the impurity atom contained in the carrier-supplying semiconductor 214.

EXEMPLARY EXPERIMENTS

First Exemplary Experiment

A semiconductor wafer used in a first exemplary experiment is the same as the semiconductor wafer 200 except for that the contact semiconductor 218 is omitted. As the base wafer 202, a GaAs single-crystal wafer was used. The buffer semiconductor 204 was i-type AlGaAs, the channel semiconductor 212 was i-type InGaAs, the carrier-supplying semiconductor 214 was n-type AlGaAs, the barrier-forming semiconductor 216 was i-type AlGaAs, the intermediate semiconductor 224 was n-type InGaP, the subcollector semiconductor 232 was n-type GaAs highly doped with an impurity atom, the collector semiconductor 234 was n-type GaAs, the base semiconductor 236 was p-type GaAs highly doped with an impurity atom, the emitter semiconductor 238 was n-type InGaP, the subemitter semiconductor 242 was n-type GaAs high doped with an impurity atom, and the emitter contact semiconductor 244 was n-type InGaAs highly doped with an impurity atom. The buffer semiconductor 204, the channel semiconductor 212, the carrier-supplying semiconductor 214, the intermediate semiconductor 224, the subcollector semiconductor 232, the collector semiconductor 234, the base semiconductor 236, the emitter semiconductor 238, the subemitter semiconductor 242, and the emitter contact semiconductor 244 were sequentially epitaxially grown on the base wafer 202 using MOCVD.

As the Group 3 source, TMG, TMA, and TMI were used. As the Group 5 source gas, arsine and phosphine were used. As the n-type impurity atom source, disilane was used. As the p-type impurity atom source, $BrCCl_3$ was used.

During the growth of the subcollector semiconductor 232, the carbon concentration was controlled by setting the molar supply ratio of the Group 5 source to the Group 3 source to 2.6. The carbon concentration of the formed subcollector semiconductor 232 was measured using secondary ion mass spectroscopy (SIMS). The results showed that the carbon concentration was $1 \times 10^{18}$ cm$^{-3}$. The electron concentration of the subcollector semiconductor 232 was $5 \times 10^{18}$ cm$^{-3}$.

After this, wet etching was carried out to remove the intermediate semiconductor 224 and the semiconductors provided thereon from the semiconductor wafer. An Al Schottky electrode was then formed so as to be in contact with the exposed barrier-forming semi conductor 216, and C-V (capacitance-voltage) measurement was carried out to evaluate the threshold voltage of the HEMT semiconductor structure layer. This evaluation method can detect the influence made by the process of forming the HBT semiconductor structure layer on the HEMT semiconductor structure layer.

Figure 10:
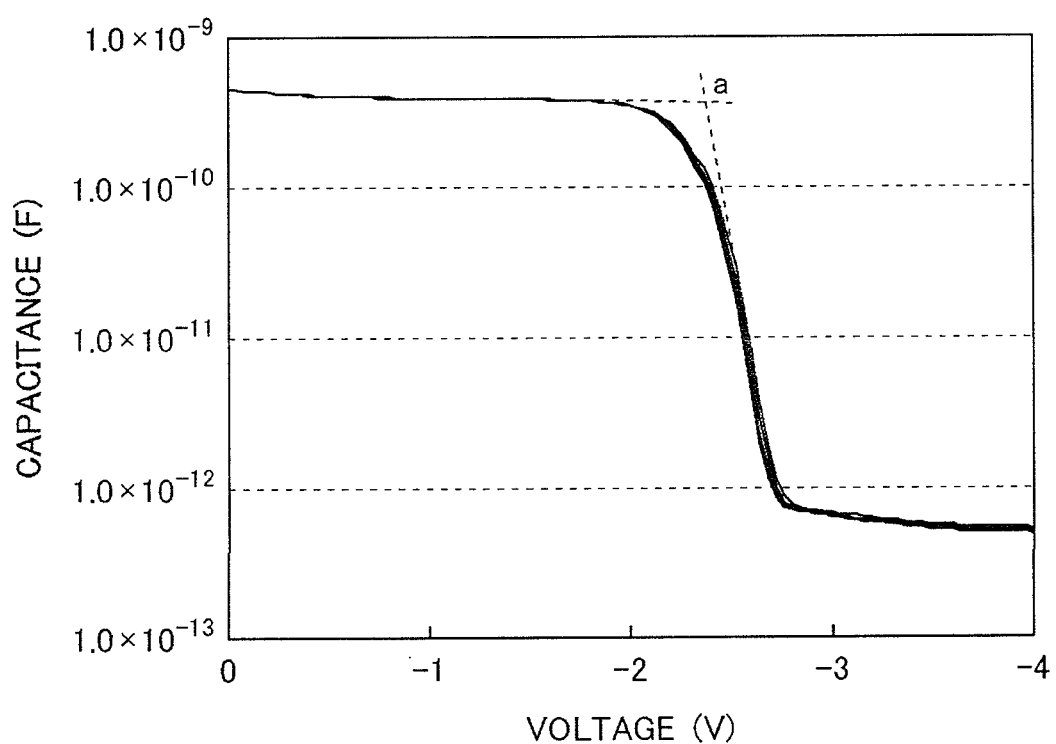
FIG. 10 illustrates the result of C-V measurement performed to evaluate the threshold voltage characteristic of First Exemplary Experiment.

FIG. 10 illustrates the C-V curve showing the results of the measurement in the first exemplary experiment. FIGS. 11 to 17 illustrate the results of the measurement in other exemplary experiments described later. In FIGS. 10 to 17, the horizontal axis represents the voltage applied to the Schottky electrode and the vertical axis represents the capacitance formed in the Schottky contact.

As seen from the C-V curve shown in FIG. 10, when a negative voltage is applied to the Schottky electrode, depletion starts at a given voltage and the capacitance thus suddenly drops. In FIG. 10, the voltage at which the capacitance suddenly drops (hereinafter referred to as the drop point) is approximately represented as the intersection a of (i) the tangential line (the dotted line) of a portion of the C-V curve during which the capacitance remains substantially constant and the voltage is relatively low and (ii) the tangential line (the dotted line) of a portion of the C-V curve during which the capacitance suddenly drops. If the HEMT semiconductor structure layer under measurement has stable characteristics, the C-V curve is reproducible. The C-V curves obtained by iterative measurement operations only slightly vary from each other, and the drop point remains substantially constant. The variation in C-V curve can predict the variation in threshold voltage of the HEMT formed by using the semiconductor wafer under measurement.

Figure 12:
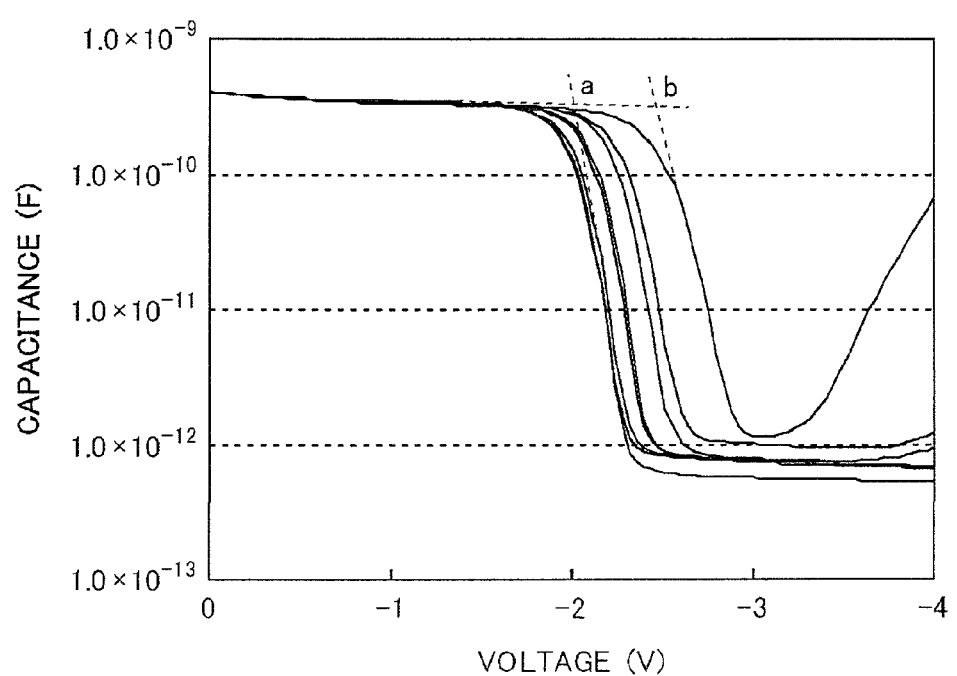
FIG. 12 illustrates the result of C-V measurement performed to evaluate the threshold voltage characteristic of Third Exemplary Experiment.

The variation in C-V curve is represented by the difference in voltage between the point a indicating the lowest drop point and the point h indicating the highest drop point as shown in FIG. 12. When the difference in voltage between the highest drop point and the lowest drop point is small as shown in FIG. 10, only the point a is shown in the drawings. FIG. 10 reveals that the results of measurement on the semiconductor wafer used in the first exemplary experiment vary only slightly and that the semiconductor wafer has stable characteristics.

Second Exemplary Experiment

Figure 11:
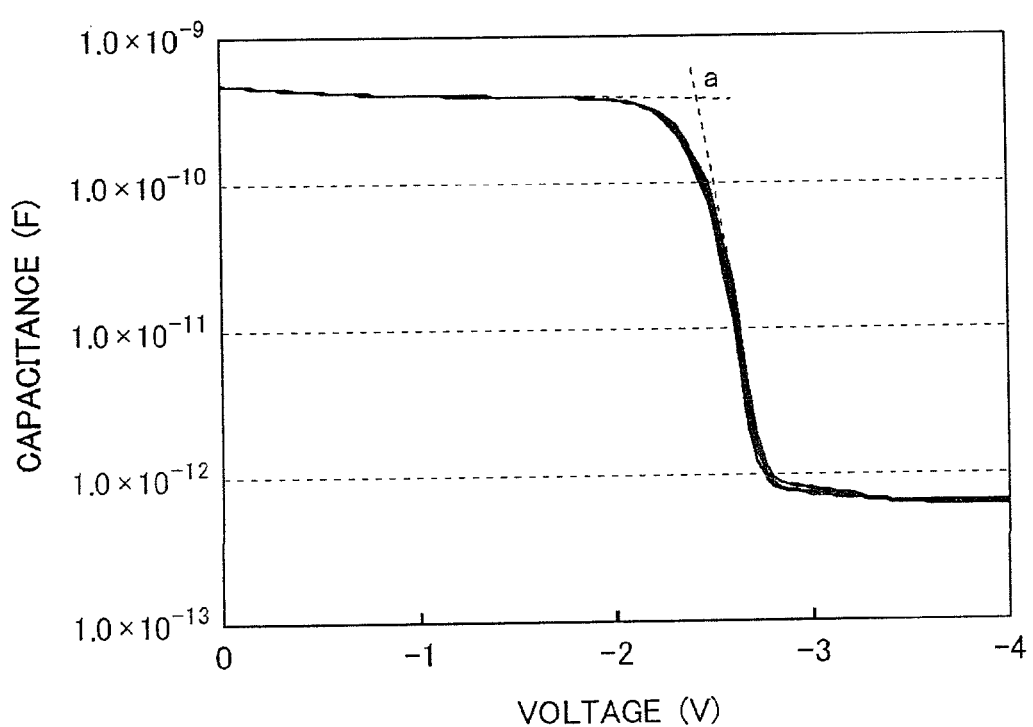
FIG. 11 illustrates the result of C-V measurement performed to evaluate the threshold voltage characteristic of Second Exemplary Experiment.

The semiconductor wafer used in a second exemplary experiment is similar to the semiconductor wafer 200 but produced only by epitaxially growing, on the base wafer 202, the buffer semiconductor 204, and the channel semiconductor 212, the carrier-supplying semiconductor 214, and the barrier-forming semiconductor 216 constituting the HEMT semiconductor structure layer. These semiconductors were formed under the same conditions as in the first exemplary experiment. An Al Schottky electrode was formed so as to be in contact with the barrier-forming semiconductor 216 of the semiconductor wafer to carry out the C-V measurement. The results of the measurement are shown in FIG. 11. The semiconductor wafer of the second exemplary experiment does not have the HBT semiconductor structure layer above the HEMT semiconductor structure layer, and the HEMT semiconductor structure layer is not affected by the producing process of the HBT semiconductor structure layer. Therefore, the results obtained in the second exemplary experiment are used as the criteria against which the results of the other exemplary experiments are compared.

Third Exemplary Experiment

The semiconductor wafer used in a third exemplary experiment was produced under the same conditions as in the first exemplary experiment except for the conditions during the growth of the subcollector semiconductor 232. During the growth of the subcollector semiconductor 232, the molar supply ratio of the Group 5 source to the Group 3 source was set to 27 to control the carbon concentration of the subcollector semiconductor 232 to fall below $3 \times 10^{16}$ cm$^{-3}$. The electron concentration of the subcollector semiconductor 232 was controlled to be $5 \times 10^{18}$ cm$^{-3}$ as in the first exemplary experiment. Furthermore, under the same conditions as in the first exemplary experiment, wet etching was performed to remove the intermediate semiconductor 224 and the semiconductors provided thereon from the semiconductor wafer, and an Al Schottky electrode was formed so as to be in contact with the barrier-forming semiconductor 216. Thus, the C-V measurement was then carried out. The results of the measurement are shown in FIG. 12.

The C-V curves measured in the first to third exemplary experiments are compared with each other. Referring to the second exemplary experiment, since the HEMT semiconductor structure layer is not affected by the formation of the HBT semiconductor structure layer, the C-V curves are highly reproducible among iterative measurement operations and the drop points of the respective C-V curves overlap the point a as shown in FIG. 11. This indicates that the HEMT semiconductor structure layer of the second exemplary experiment has stable characteristics. Referring to the HEMT semiconductor structure layer of the third exemplary experiment, on the other hand, the measured C-V curves vary widely and the difference in voltage between the drop point a and the drop point b is 0.45 V as shown in FIG. 12. This indicates that the formation of the HBT semiconductor structure layer, which is constituted by the subcollector semiconductor 232 and the semiconductor layers disposed thereon, degrades the characteristics of the HEMT semiconductor structure layer, which is positioned below the HBT semiconductor structure layer. As shown in FIG. 10, however, the HEMT semiconductor structure layer of the first exemplary experiment has stable characteristics, substantially equally to the HEMT semiconductor structure layer of the second exemplary experiment, even through the HBT semiconductor structure layer is formed above the HEMT semiconductor structure.

The characteristics of the HEMT semiconductor structure layer are thought to be degraded due to the following reasons. The subcollector semiconductor 232 in the HBT semiconductor structure layer is highly doped with impurity atoms. The impurity atoms are thought to generate crystal defects in the semiconductor.

The generated crystal defects are thought to propagate into the HEMT semiconductor structure layer during the step of forming the HBT semiconductor structure layer and thus degrade the characteristics of the HEMT semiconductor structure layer. Here, in the first exemplary experiment, a large amount of carbon atoms are added to the subcollector semiconductor 232 as the second impurity atom. The carbon atoms serve to reduce the difference between the charge neutrality level and the Fermi level of the subcollector semiconductor 232 doped with the first impurity atoms, as a result of which the crystal structure is stabilized and crystal defects are prevented from occurring.

Fourth Exemplary Experiment

Figure 13:
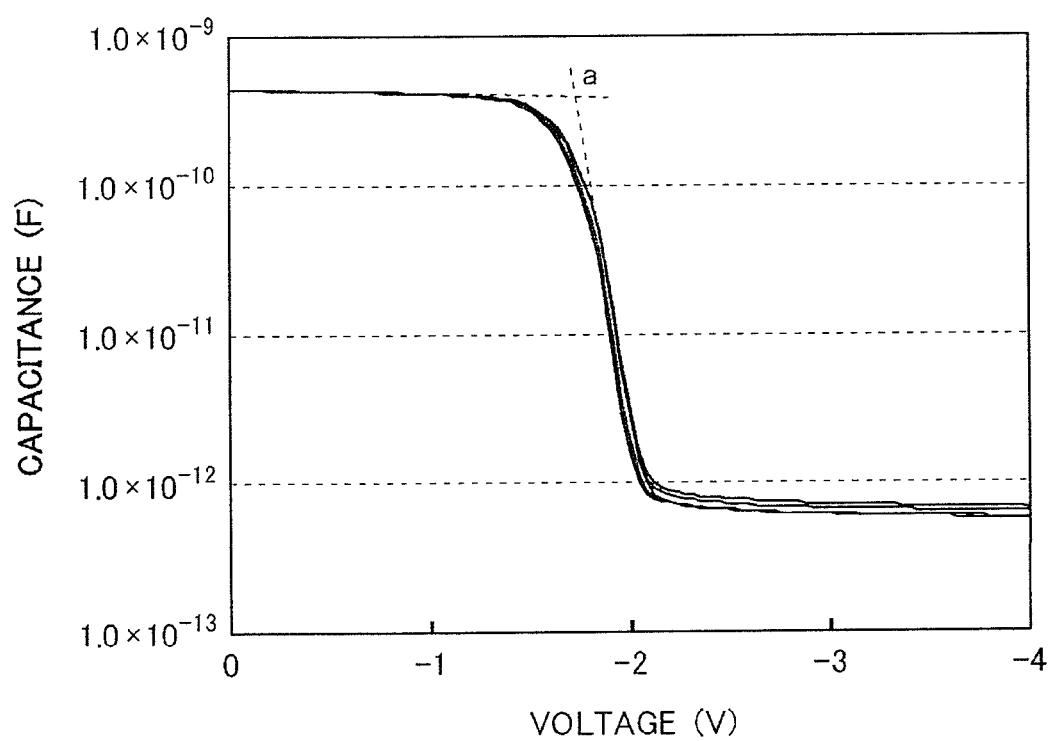
FIG. 13 illustrates the result of C-V measurement performed to evaluate the threshold voltage characteristic of Fourth Exemplary Experiment.

In fourth to sixth exemplary experiments, the carbon concentration of the subcollector semiconductor 232 was varied to examine what influences the variation in carbon concentration makes. The semiconductor wafer used in the fourth exemplary experiment was produced under the same conditions as in the first exemplary experiment except for the conditions during the growth of the subcollector semiconductor 232. During the growth of the subcollector semiconductor 232, the carbon concentration of the subcollector semiconductor 232 was controlled by setting the molar supply ratio of the Group 5 source to the Group 3 source to 5.4. The carbon concentration of the subcollector semiconductor 232 was $5 \times 10^{17}$ cm$^{-3}$. The electron concentration of the subcollector semiconductor 232 was $3 \times 10^{18}$ cm$^{-3}$. Furthermore, under the same conditions as in the first exemplary experiment, wet etching was performed to remove the intermediate semiconductor 224 and the semiconductors provided thereon from the semiconductor wafer, and an Al Schottky electrode was formed so as to be in contact with the barrier-forming semiconductor 216. Thus, the C-V measurement was then carried out. The results of the measurement are shown in FIG. 13.

Fifth Exemplary Experiment

Figure 14:
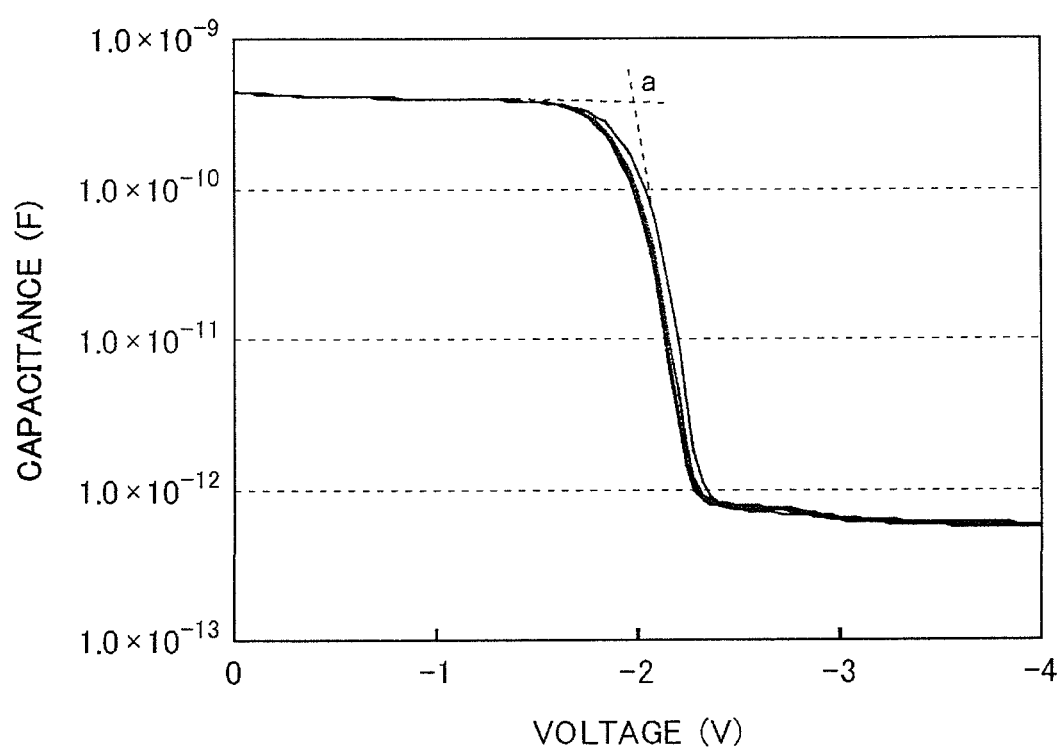
FIG. 14 illustrates the result of C-V measurement performed to evaluate the threshold voltage characteristic of Fifth Exemplary Experiment.

The semiconductor wafer used in the fifth exemplary experiment was produced under the same conditions as in the first exemplary experiment except for the conditions during the growth of the subcollector semiconductor 232. During the growth of the subcollector semiconductor 232, the carbon concentration of the subcollector semiconductor 232 was controlled by setting the molar supply ratio of the Group 5 source to the Group 3 source to 1.65. The carbon concentration of the subcollector semiconductor 232 was $5 \times 10^{18}$ cm$^{-3}$. The electron concentration of the subcollector semiconductor 232 was $5 \times 10^{18}$ cm$^{-3}$. Furthermore, under the same conditions as in the first exemplary experiment, wet etching was performed to remove the intermediate semiconductor 224 and the semiconductors provided thereon from the semiconductor wafer, and an Al Schottky electrode was formed so as to be in contact with the barrier-forming semiconductor 216. Thus, the C-V measurement was then carried out. The results of the measurement are shown in FIG. 14.

Sixth Exemplary Experiment

The semiconductor wafer used in the sixth exemplary experiment was produced under the same conditions as in the first exemplary experiment except for the conditions during the growth of the subcollector semiconductor 232. During the growth of the subcollector semiconductor 232, the molar supply ratio of the Group 5 source to the Group 3 source was set to 1.3 to control the carbon concentration of the subcollector semiconductor 232 to be $1\times10^{19}$ cm$^{-3}$. The electron concentration of the subcollector semiconductor 232 was $6\times10^{18}$ cm$^{-3}$. Furthermore, under the same conditions as in the first exemplary experiment, wet etching was performed to remove the intermediate semiconductor 224 and the semiconductors provided thereon from the semiconductor wafer, and an Al Schottky electrode was formed in contact with the Group 3 source during the growth of the subcollector semiconductor 232 is not lower than 1.3 and not higher than 6, preferably, not lower than 1.6 and not higher than 6. In other words, the carbon concentration of the subcollector semiconductor 232 may be not lower than $5\times10^{17}$ cm$^{-3}$ and not higher than $1\times10^{19}$ cm$^{-3}$, preferably not lower than $5\times10^{17}$ cm$^{-3}$ and not higher than $5\times10^{18}$ cm$^{-3}$. The electron concentration of the subcollector semiconductor 232 is not lower than $1\times10^{18}$ cm$^{-3}$ and not higher than $6\times10^{18}$ cm$^{-3}$, preferably not lower than $2\times10^{18}$ cm$^{-3}$ and not higher than $5\times10^{18}$ cm$^{-3}$.

TABLE 1

Figure 15:
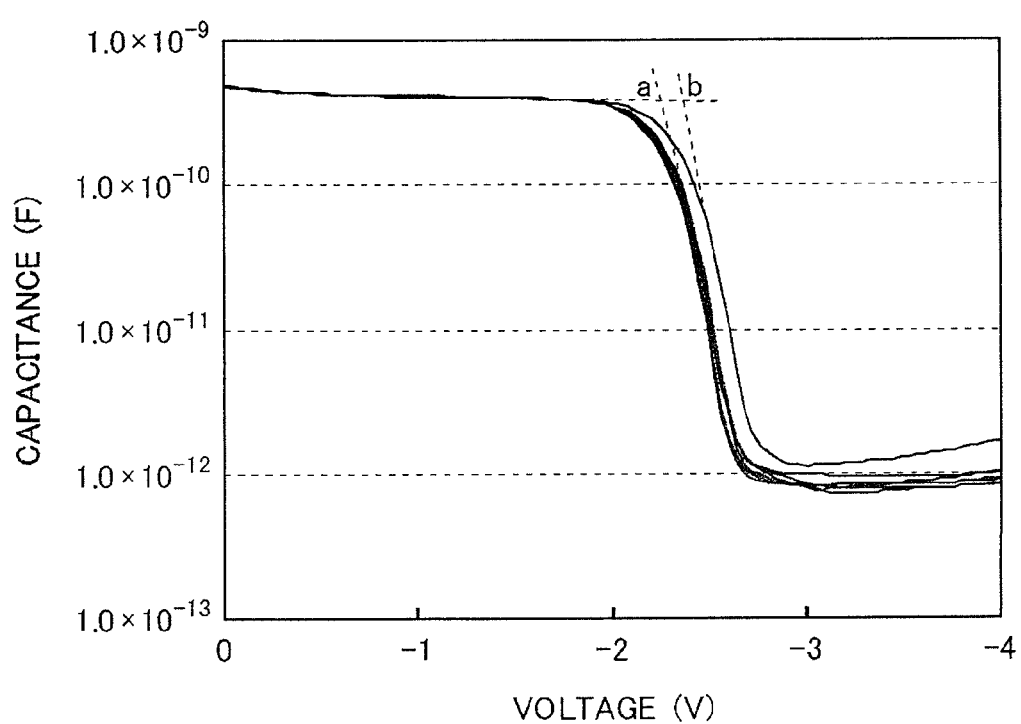
FIG. 15 illustrates the result of C-V measurement performed to evaluate the threshold voltage characteristic of Sixth Exemplary Experiment.

|  | EXEMPLARY EXPERIMENT 7 | EXEMPLARY EXPERIMENT 3 | EXEMPLARY EXPERIMENT 4 | EXEMPLARY EXPERIMENT 1 | EXEMPLARY EXPERIMENT 5 | EXEMPLARY EXPERIMENT 6 |
| --- | --- | --- | --- | --- | --- | --- |
| GROUP 5 SOURCE/ GROUP 3 SOURCE (MOLAR RATIO) | 27 | 27 | 5.4 | 2.6 | 1.65 | 1.3 |
| CARBON CONCENTRATION OF SUB-COLLECTOR SEMICONDUCTOR (cm$^{-3}$) | $<3\times10^{16}$ | $<3\times10^{16}$ | $5\times10^{17}$ | $1\times10^{18}$ | $5\times10^{18}$ | $1\times10^{19}$ |
| ELECTRON CONCENTRATION OF SUB-COLLECTOR SEMICONDUCTOR (cm$^{-3}$) | $<1\times10^{18}$ | $5\times10^{18}$ | $3\times10^{18}$ | $5\times10^{18}$ | $5\times10^{18}$ | $6\times10^{18}$ |
| REPRODUCIBILITY OF C-V CURVE | GOOD | ACCEPTABLE | GOOD | GOOD | GOOD | GOOD | barrier-forming semiconductor 216. Thus, the C-V measurement was then carried out. The results of the measurement are shown in FIG. 15.

The C-V curves measured in the fourth to sixth exemplary experiments (FIGS. 13 to 15) are compared with each other. Although the C-V curves measured in the sixth exemplary experiment, in which the carbon concentration of the subcollector semiconductor 232 is $1\times10^{19}$ cm$^{-3}$, show variation of approximately 0.13 V, which is the difference in voltage between the drop point a and the drop point b, the HEMT semiconductor structure layers relating to all of the fourth to sixth exemplary experiments do not show large variation as observed in the third exemplary experiment and thus have stable characteristics.

Seventh Exemplary Experiment

The semiconductor wafer used in the seventh exemplary experiment was produced under the same conditions as in the third exemplary experiment except for that the electron concentration of the subcollector semiconductor 232 was set to less than $1\times10^{18}$ cm$^{-3}$. Furthermore, under the same conditions as in the first exemplary experiment, wet etching was performed to remove the intermediate semiconductor 224 and the semiconductors provided thereon from the semiconductor wafer, and an Al Schottky electrode was formed so as to be in contact with the barrier-forming semiconductor 216. Thus, the C-V measurement was then carried out. The results of the measurement are shown in FIG. 16.

Figure 16:
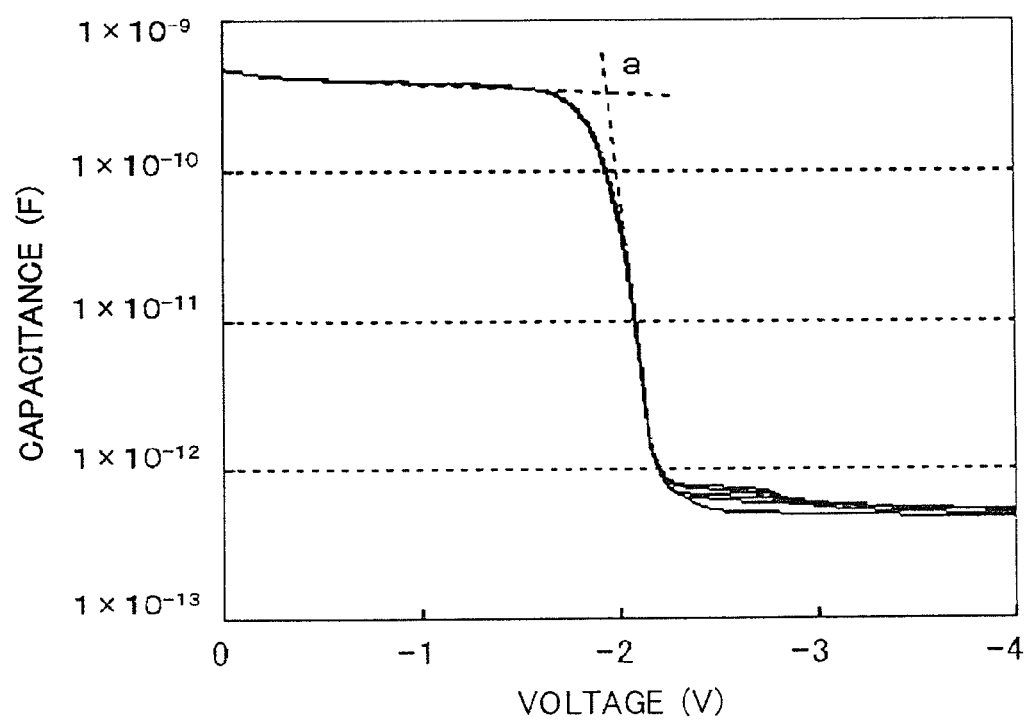
FIG. 16 illustrates the result of C-V measurement performed to evaluate the threshold voltage characteristic of Seventh Exemplary Experiment.

When the electron concentration of the subcollector semiconductor 232 is low, the HEMT semiconductor structure layer has stable characteristics as shown in FIG. 16.

Table 1 shows the results measured in the first to seventh exemplary experiments. The results indicate that the HEMT semiconductor structure layer achieves stable characteristics when the molar supply ratio of the Group 5 source to the Eighth Exemplary Experiment The semiconductor wafer used in an eighth exemplary experiment was produced under the same conditions as in the third exemplary experiment except for the conditions during the growth of the intermediate semiconductor 224. The intermediate semiconductor 224 was formed by forming a multilayer structure including ten two-layer structures constituted by GaAs and Al0.25Ga0.75As and then growing n-type InGaP on the multilayer structure. Furthermore, under the same conditions as in the first exemplary experiment, wet etching was performed to remove the intermediate semiconductor 224 and the semiconductors provided thereon from the semiconductor wafer, and an Al Schottky electrode was formed in contact with the barrier-forming semiconductor 216. Thus, the C-V measurement was then carried out. The results of the measurement are shown in FIG. 17.

Figure 17:
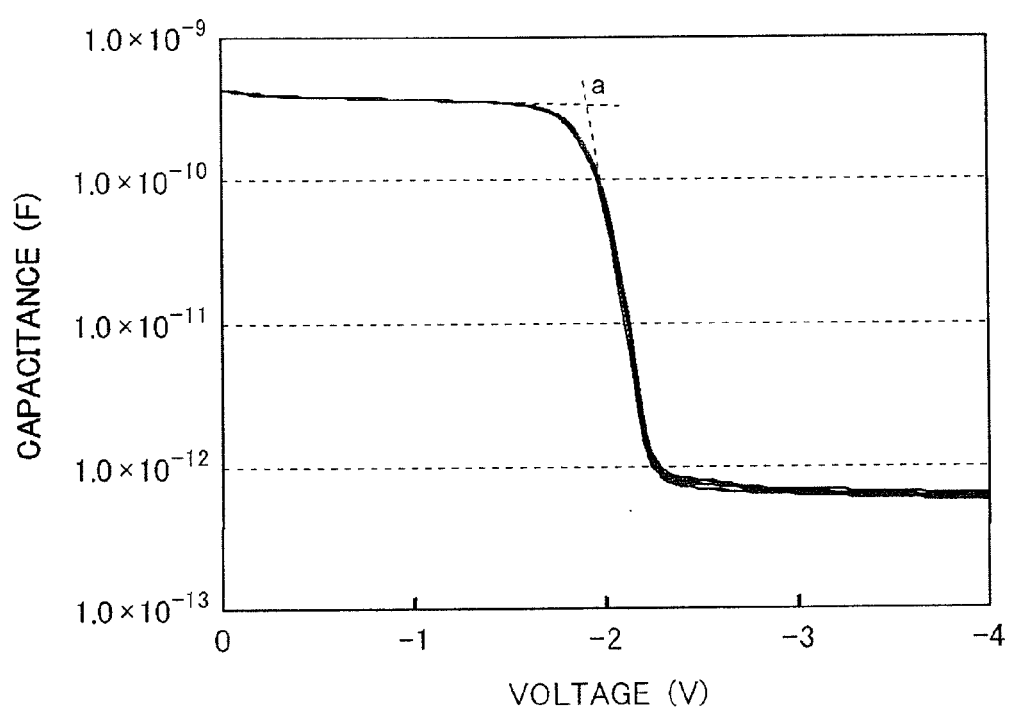
FIG. 17 illustrates the result of C-V measurement performed to evaluate the threshold voltage characteristic of Eighth Exemplary Experiment.

Although the semiconductor wafer used in the eighth exemplary experiment has the same configuration as the semiconductor wafer used in the third exemplary experiment except for the configuration of the intermediate semiconductor 224, the HEMT semiconductor structure layer of the eighth exemplary experiment has stable characteristics as shown in FIG. 17. This is thought to be because the difference in forbidden band width between GaAs and Al0.25Ga0.75As constituting the intermediate semiconductor 224 forms an energy barrier at the heterojunction between GaAs and Al0.25Ga0.75As and the energy barrier effectively reduces the adverse effects of the high concentration of impurity atoms contained in the subcollector semiconductor 232. The ten two-layer structures constituted by GaAs and Al0.25Ga0.75As form a plurality of heterojunctions and thus form a plurality of energy barriers, which is thought to significantly enhance the above preventive effects.

The above-described embodiments can provide a semiconductor wafer in which both an HEMT semiconductor structure layer and an HBT semiconductor structure layer can be formed without allowing the formation of the HBT semiconductor structure layer to degrade the characteristics of the HEMT semiconductor structure layer, by adding, to the semiconductor in the HBT semiconductor structure layer that contains a high concentration of impurity atom, a second impurity atom that reduces the difference between the charge neutrality level and the Fermi level of the semiconductor containing the high concentration of impurity atom. Thus, the semiconductor wafer can be used to monolithically form therein an HEMT with a stable threshold voltage and an HBT. The above-described embodiments can also provide a method of producing the semiconductor wafer and an electronic device formed using the semiconductor wafer.

The same effects can be produced by providing, between the HEMT semiconductor structure layer and the HBT semiconductor structure layer, an multilayered intermediate semiconductor having a heterojunction forming an energy barrier.

What is claimed is:

1. A semiconductor wafer comprising:
   a first semiconductor; and
   a second semiconductor formed directly or indirectly on the first semiconductor, wherein
   the second semiconductor contains:
   a first impurity atom that exhibits p-type conductivity or n-type conductivity; and
   a second impurity atom that is selected such that the Fermi level of the second semiconductor containing both the first and second impurity atoms is closer to the Fermi level of the second semiconductor containing neither the first impurity atom nor the second impurity atom, than the Fermi level of the second semiconductor containing the first impurity atom is.

2. The semiconductor wafer as set forth in claim 1, wherein
   the majority carrier of the second semiconductor is an electron, and
   the Fermi level of the second semiconductor containing the first and second impurity atoms is lower than the Fermi level of the second semiconductor containing the first impurity atom.

3. The semiconductor wafer as set forth in claim 2, wherein
   the second semiconductor is a Group 3-5 compound semiconductor, and
   the second impurity atom is at least one member selected from the group consisting of beryllium, boron, carbon, magnesium, and zinc.

4. The semiconductor wafer as set forth in claim 3, wherein
   the electron concentration of the second semiconductor is not lower than $1\times10^{18}$ cm$^{-3}$ and not higher than $6\times10^{18}$ cm$^{-3}$.

5. The semiconductor wafer as set forth in claim 4, wherein
   the electron concentration of the second semiconductor is not lower than $2\times10^{18}$ cm$^{-3}$ and not higher than $6\times10^{18}$ cm$^{-3}$.

6. The semiconductor wafer as set forth in claim 4, wherein
   the concentration of the second impurity atom is not lower than $5\times10^{17}$ cm$^{-3}$ and not higher than $1\times10^{19}$ cm$^{-3}$.

7. The semiconductor wafer as set forth in claim 3, wherein
   the first semiconductor is a Group 3-5 compound semiconductor, and
   the semiconductor wafer further comprises an intermediate layer that is formed between the first semiconductor and the second semiconductor and made of $Al_xGa_{1-x}As$ ($0\le x\le 1$) or $Al_yIn_zGa_{1-y-z}$ ($0\le y\le 1$, $0\le z\le 1$).

8. The semiconductor wafer as set forth in claim 7, wherein
   the intermediate layer includes a stack having a $Al_pGa_{1-p}As$ layer and a $Al_qGa_{1-q}As$ layer ($0\le p\le 1$, $0\le q\le 1$, $p<q$) stacked on one another.

9. The semiconductor wafer as set forth in claim 3, wherein
   the first semiconductor includes an intrinsic semiconductor.

10. The semiconductor wafer as set forth in claim 3, wherein
    the first semiconductor includes a stack having an n-type semiconductor and a p-type semiconductor stacked on one another.

11. An electronic device comprising a transistor that includes a control terminal that controls a current flowing through the first semiconductor of the semiconductor wafer as set forth in claim 3.

12. The electronic device as set forth in claim 11, further comprising
    a third semiconductor that is formed between the first semiconductor and the second semiconductor and is lower in electron affinity than the first semiconductor, wherein
    the transistor is a field-effect transistor that uses, as a channel, a two-dimensional carrier gas formed on the first-semiconductor side with respect to a heterointerface between the third semiconductor and the first semiconductor.

13. The electronic device as set forth in claim 12, further comprising:
    a fourth semiconductor that is epitaxially grown directly or indirectly on the second semiconductor and contains an impurity that exhibits a first conductivity type that is the same as the conductivity type exhibited by the impurity contained in the second semiconductor, the concentration of the impurity contained in the fourth semiconductor being lower than the concentration of the impurity contained in the second semiconductor;
    a fifth semiconductor that is epitaxially grown directly or indirectly on the fourth semiconductor and contains an impurity that exhibits a second conductivity type that is opposite to the first conductivity type;
    a sixth semiconductor that is epitaxially grown directly or indirectly on the fifth semiconductor and contains an impurity that exhibits the first conductivity type; and
    a heterojunction bipolar transistor that has a subcollector formed in the second semiconductor, a collector formed in the fourth semiconductor, a base formed in the fifth semiconductor, and an emitter formed in the sixth semiconductor.

14. The electronic device as set forth in claim 13, wherein
    the concentration of the two-dimensional carrier gas of the field-effect transistor is not lower than $1\times10^{11}$ cm$^{-2}$ and not higher than $5\times10^{12}$ cm$^{-2}$.

15. A method of producing a semiconductor wafer, the method comprising:
    forming a first semiconductor; and
    forming a second semiconductor directly or indirectly on the first semiconductor, wherein
    the second semiconductor contains:
    a first impurity atom that exhibits p-type conductivity or n-type conductivity; and
    a second impurity atom that is selected such that the Fermi level of the second semiconductor containing both the first and second impurity atoms is closer to the Fermi level of the second semiconductor containing neither the first impurity atom nor the second impurity atom, than the Fermi level of the second semiconductor containing the first impurity atom is.

16. The method as set forth in claim 15 of producing a semiconductor wafer, the method further comprising:
    epitaxially growing a fourth semiconductor directly or indirectly on the second semiconductor, the fourth semiconductor containing an impurity that exhibits a first conductivity type that is the same as the conductivity type of the impurity contained in the second semiconductor;

epitaxially growing a fifth semiconductor directly or indirectly on the fourth semiconductor, the fifth semiconductor containing an impurity that exhibits a second conductivity type opposite to the first conductivity type; and epitaxially growing a sixth semiconductor directly or indirectly on the fifth semiconductor, the sixth semiconductor that exhibits the first conductivity type, wherein the concentration of the impurity that exhibits the first conductivity type contained in the fourth semiconductor is lower than the concentration of the impurity that exhibits the first conductivity type contained in the second semiconductor.

17. The method as set forth in claim 15 of producing a semiconductor wafer, wherein the second semiconductor is an n-type Group 3-5 compound semiconductor, and during the formation of the second semiconductor, the Group 3-5 compound semiconductor is epitaxially grown on the first semiconductor in a molar supply ratio of a Group 5 source to a Group 3 source being adjusted to fall within a range of from 1 to 6.

* * * * *